(12) United States Patent
Shohraku

(10) Patent No.: US 8,421,937 B2
(45) Date of Patent: Apr. 16, 2013

(54) ACTIVE MATRIX SUBSTRATE, LIQUID CRYSTAL PANEL, TELEVISION RECEIVER, METHOD FOR PRODUCING LIQUID CRYSTAL PANEL

(75) Inventor: Akihiro Shohraku, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 344 days.

(21) Appl. No.: 12/744,220

(22) PCT Filed: Sep. 5, 2008

(86) PCT No.: PCT/JP2008/066070
§ 371 (c)(1),
(2), (4) Date: May 21, 2010

(87) PCT Pub. No.: WO2009/066498
PCT Pub. Date: May 28, 2009

(65) Prior Publication Data
US 2010/0245679 A1    Sep. 30, 2010

(30) Foreign Application Priority Data

Nov. 22, 2007   (JP) ................................. 2007-303749

(51) Int. Cl.
*G02F 1/1343* (2006.01)
*G02F 1/136* (2006.01)
(52) U.S. Cl.
USPC .............................................. 349/39; 349/48
(58) Field of Classification Search ............... 349/39, 349/48
See application file for complete search history.

(56) References Cited

U.S. PATENT DOCUMENTS 5,796,448 A * 8/1998 Kim ................................. 349/39
5,943,106 A * 8/1999 Sukenori et al. ................. 349/39
7,978,273 B2 * 7/2011 Takeuchi et al. ................. 349/39
2002/0131010 A1    9/2002 Ozaki et al.
(Continued)

FOREIGN PATENT DOCUMENTS

| JP | 9-22023 A | 1/1997 |
| JP | 2001-305581 A | 10/2001 |

(Continued)

*Primary Examiner* — James Dudek
(74) *Attorney, Agent, or Firm* — Birch, Stewart, Kolasch & Birch, LLP

(57) ABSTRACT

An active matrix substrate includes: storage capacitor line extended sections 118*ax*, 118*qx*, etc. each extending from a position on a storage capacitor line between (i) an intersection with one of two adjacent data signal lines 15 and 15*q* and (ii) an intersection with the other one of the two data signal lines 15 and 15*q*; and data signal line extended sections 15*e* and 15*qe* each extending from a position on a data signal line 15 or 15*q* between (i) an intersection with one of two adjacent scanning signal lines 16 and 16*q* and (ii) an intersection with the other one of the two adjacent scanning signal lines 16 and 16*q*, wherein a storage capacitor line extended section 118*ax* or 118*ay* extending from one of two adjacent storage capacitor lines 18*a* and 18*q* sandwiching no scanning signal line is connected with a storage capacitor line extended section 118*qx* or 118*qy* extending from the other one of the two adjacent storage capacitor lines 18*a* and 18*q*, wherein each of the storage capacitor line extended sections 118*ax*, 118*ay*, 118*qz*, and 118*qy* includes a section that does not overlap a pixel electrode, wherein each of the data signal line extended sections 118*ax*, 118*ay*, 118*qz*, and 118*qy* has a section overlapping a scanning signal line. This configuration makes it possible to correct a disconnection of a scanning signal line in an active matrix substrate.

20 Claims, 15 Drawing Sheets

U.S. PATENT DOCUMENTS

| | | |
|---|---|---|
| 2002/0154079 A1 | 10/2002 | Shiota et al. |
| 2009/0251615 A1 | 10/2009 | Tsubata |
| 2009/0262274 A1 | 10/2009 | Noda et al. |
| 2010/0296020 A1 | 11/2010 | Noda et al. |
| 2011/0049525 A1 | 3/2011 | Tsubata |
| 2011/0122353 A1 | 5/2011 | Tsubata |
| 2011/0122354 A1 | 5/2011 | Noda et al. |
| 2012/0236226 A1 | 9/2012 | Noda et al. |

FOREIGN PATENT DOCUMENTS

| | | |
|---|---|---|
| JP | 2001-305586 A | 10/2001 |
| JP | 2002-116712 A | 4/2002 |
| JP | 2002-268089 A | 9/2002 |
| WO | WO 2006/064789 A1 | 6/2006 |
| WO | WO 2007/034596 A1 | 3/2007 |

* cited by examiner

Connectable To Auxiliary Line

F I G. 1 6
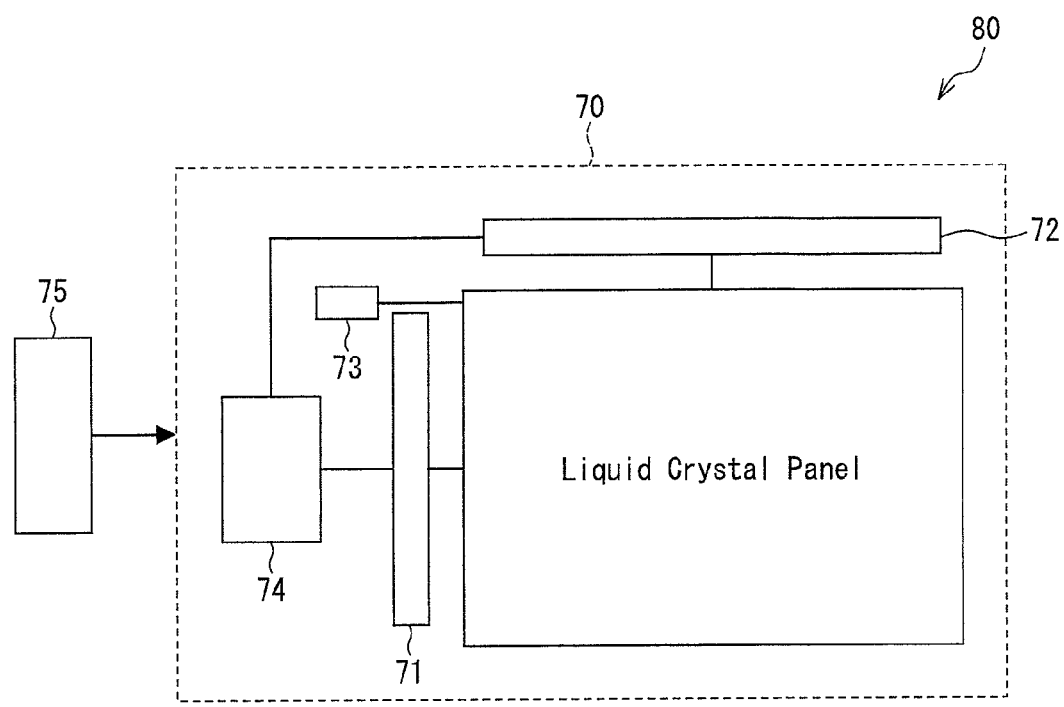

ACTIVE MATRIX SUBSTRATE, LIQUID CRYSTAL PANEL, TELEVISION RECEIVER, METHOD FOR PRODUCING LIQUID CRYSTAL PANEL

TECHNICAL FIELD

The present invention relates to an active matrix substrate capable of correcting a disconnection of a scanning signal line, and a liquid crystal panel using the active matrix substrate.

BACKGROUND ART

FIG. 17 shows a conventional configuration of an active matrix substrate (of a pixel division system) that has a multi-pixel structure. As shown in FIG. 17, an active matrix substrate 905 includes data signal lines 915 extending in a column direction, scanning signal lines 916 extending in a row direction, storage capacitor lines 918a and 918b extending in the row direction, and pixel areas 903 partitioned by the data signal lines and the storage capacitor lines. Each scanning signal line 916 crosses a center of corresponding pixel areas 903. In each pixel area 903, first and second transistors 912a and 912b, and first and second pixel electrodes 917a and 917b are formed. Note that one storage capacitor line (918a or 918b) is provided so as to correspond to two pixel areas adjacent to each other in the column direction, and each of the storage capacitor lines (918a and 918b) is shared by two pixel areas adjacent to each other in the column direction.

In a pixel area 903, the first and second transistors 912a and 912b have a common source electrode 908 connected to a corresponding data signal line 915. The first transistor 912a has a drain electrode 909a connected to a first pixel electrode 917a via a contact hole 911a. The second transistor 912b has a drain electrode 909b connected to a second pixel electrode 917b via a contact hole 911b. Note that the scanning signal line 916 functions as a gate electrode of each of the first and second transistors 912a and 912b.

Further, the storage capacitor line 918a overlaps the first pixel electrode 917a while the storage capacitor line 918b overlaps the second pixel electrode 917b. This forms a first storage capacitor between the storage capacitor line 918a and the first pixel electrode 917a and a second storage capacitor between the second storage capacitor line 918b and the second pixel electrode 917b.

In a liquid crystal display device including the active matrix substrate 905, each section corresponding to the pixel area 903 forms one pixel. In one pixel, a first sub-pixel is formed so as to include the first electrode 917a and a second sub-pixel is formed so as to include the second pixel electrode 917b. In the liquid crystal display device, though a potential of a signal supplied from the data signal line 915 to the first pixel electrode 917a is the same as a potential of a signal supplied from the data signal line 915 to the second pixel electrode 917b, the potential to the first pixel electrode 917a via the first storage capacitor may be arranged to be different from the potential to the second pixel electrode 917b via the second storage capacitor by separately controlling potentials of the storage capacitor lines 918a and 918b (e.g., by controlling the potentials so that one of the potentials is pumped up while the other one of the potentials is pumped down.).

Therefore, in the liquid crystal display device, expression of gray levels is possible by arranging one pixel with use of a sub-pixel having a high luminance (bright sub-pixel) and a sub-pixel having a low luminance (dark sub-pixel). Further, dependency of gamma characteristic on a viewing angle (e.g., a phenomenon in which a screen appears whitish) can be improved.

Among active matrix substrates, there is an active matrix substrate provided with auxiliary lines (not shown) for correcting a defect such as a disconnection of a data signal line. In such an active matrix substrate, as shown in FIG. 18, a disconnection of a data line can be corrected by connecting a section subsequent to the disconnection to an auxiliary line (i.e., by supplying a signal potential via the auxiliary line) even if a disconnection of the data signal line occurs.

Patent Literature 1 is one example of a well-known document relevant to the present invention.

CITATION LIST

Patent Literature 1

Japanese Patent Application Publication, Tokukai, No. 2001-305586 A (Publication Date: Oct. 31, 2001)

SUMMARY OF INVENTION

However, the conventional active matrix substrate cannot correct a disconnection of a scanning signal line, which is a problem.

The present invention is attained in view of the above problem and an object of the present invention is to provide an active matrix substrate capable of correcting a disconnection of a scanning signal line.

An active matrix substrate of the present invention includes: scanning signal lines extending in a first direction; data signal lines extending in a second direction; a plurality of storage capacitor lines extending in the first direction; pixel electrodes in pixel areas each crossed by one scanning signal line, each of the pixel areas including at least one pixel electrode provided on one side of the one scanning signal line and at least one pixel electrode provided on another side of the one scanning signal line, the each pixel area being crossed by one storage capacitor line on one side of the one scanning signal line and by another storage capacitor line on another side of the scanning signal line; storage capacitor line extended sections each extending from a position on a storage capacitor line between (i) an intersection of the storage capacitor line and one of two adjacent data signal lines and (ii) an intersection of the storage capacitor line and another one of the two adjacent data signal lines; and data signal line extended sections each extending from a position on a data signal line between (i) an intersection of the data signal line and one of two adjacent scanning signal lines and (ii) an intersection of the data signal line and another one of the two adjacent scanning signal lines, wherein a storage capacitor line extended section extending from one of two adjacent storage capacitor lines that sandwich no scanning signal line and being positioned in a space between the two adjacent data signal lines is connected with another storage capacitor line extended section extending from another one of the two adjacent storage capacitor lines and positioned in the space, wherein each of the storage capacitor line extended sections includes a section that does not overlap a pixel electrode, wherein each of the data signal line extended sections has a section overlapping a scanning signal line.

First, the steps for correcting a disconnection of a scanning signal line are performed as described below, in a configuration in which the each data signal line extended section extends from a position on the data signal line between (i) an intersection of the data signal line and the scanning signal line overlapping the each data signal line extended section and (ii) an intersection of the data signal line and a storage capacitor line adjacent to the scanning signal line.

That is, by carrying out the steps of: in a case where a disconnection occurs in a predetermined scanning signal line, on an assumption that one of two storage capacitor lines adjacent to the predetermined scanning signal line is an adjacent storage capacitor line and that one of two scanning signal lines adjacent to the predetermined scanning signal line is an adjacent scanning signal line, the one scanning signal line being positioned on a same side as the adjacent storage capacitor line and on an assumption that two data signal lines sandwiching a position of the disconnection are a first data signal line and a second data signal line and that a data signal line extended section extending from the first data signal line is a first data signal line extended section and a data signal line extended section extending from the second data signal line is a second data signal line extended section, (i) cutting the first data signal line at a position between an intersection of the first data signal line and the predetermined scanning signal line and an intersection of the first data signal line and the adjacent storage capacitor line and at a position between an intersection of the first data signal line and the adjacent storage capacitor line and an intersection of the first data signal line and the adjacent scanning signal line and (ii) cutting the second data signal line at a position between an intersection of the second data signal line and the predetermined scanning signal line and an intersection of the second data signal line and the adjacent storage capacitor line and at a position between an intersection of the second data signal line and the adjacent storage capacitor line and an intersection of the second data signal line and the adjacent scanning signal line; (i) cutting off a portion of the adjacent storage capacitor line from an intersection of the adjacent storage capacitor line and the first data signal line to an intersection of the adjacent storage capacitor line and the second data signal line, and (ii) cutting a storage capacitor line extended section extending from the adjacent storage capacitor line at a position that does not overlap a pixel electrode; (i) melt-connecting the first data signal line extended section and the predetermined scanning signal line at a position where the first data signal line extended section overlaps the predetermined scanning signal line and (ii) melt-connecting the second data signal line extended section and the predetermined scanning signal line at a position where the second data signal line extended section overlaps the predetermined scanning signal line; and (i) melt-connecting the first data signal line and the adjacent storage capacitor line at an intersection of the first data signal line and the adjacent storage capacitor line and (ii) melt-connecting the second data signal line and the adjacent storage capacitor line at an intersection of the second data signal line and the adjacent storage capacitor line, a bypass (roundabout route) is formed for the predetermined scanning signal line (scanning signal line where a disconnection occurs). This bypass is made of the first data signal line extended section, a section cut off from the first data signal line, a portion cut off from the adjacent storage capacitor line, a portion cut off from the second data signal line and the second data signal line extended section. This allows a scanning signal to be transmitted to a section subsequent to the disconnection on the predetermined scanning signal line via the bypass. Note that to the section subsequent to the position of the disconnection of the scanning signal line on a downstream side of each of the first and second data signal lines, a signal potential (a potential corresponding to a data signal) may be supplied via, for example, an auxiliary line. As described above, in the above configuration, a disconnection of a scanning signal line can be corrected. This makes it possible to improve a process yield in production of the active matrix substrate.

Further, the steps for correcting a disconnection of a scanning signal line are performed as described below, in a configuration in which: on an assumption that one of two storage capacitor lines adjacent to the scanning signal line which the each data signal line extended section overlaps is an adjacent storage capacitor line and that one of two scanning signal lines adjacent to the scanning signal line which the each data signal line extended section overlaps is an adjacent scanning signal line, the one scanning signal line being positioned on a same side as the adjacent storage capacitor line, the each data signal line extended section extends from a position on the data signal line between (i) an intersection of the data signal line and the scanning signal line which the data signal line extended section overlaps and (ii) an intersection of the data signal line and the one storage capacitor line adjacent to this scanning signal line That is, by performing the steps of: in a case where a disconnection occurs in a predetermined scanning signal line, on an assumption that a storage capacitor line adjacent to the predetermined scanning signal line is an adjacent storage capacitor line and that one of two scanning signal lines adjacent to the predetermined scanning signal line is an adjacent scanning signal line, the one scanning signal line being positioned on a same side as the adjacent storage capacitor line, and on an assumption that two data signal lines sandwiching a position of the disconnection are a first data signal line and a second data signal line and that a data signal line extended section extending from the first data signal line is a first data signal line extended section and a data signal line extended section extending from the second data signal line is a second data signal line extended section, (i) cutting the first data signal line extended section at a position between a point connecting the first data signal line extended section with the first data signal line and an intersection of the first data signal line extended section and the adjacent storage capacitor line and (ii) cutting the second data signal line extended section at a position between a point connecting the second data signal line extended section with the second data signal line and an intersection of the second data signal line extended section and the adjacent storage capacitor line; (i) cutting off a portion of the adjacent storage capacitor line from an intersection of the adjacent storage capacitor line and the first data signal line extended section to an intersection of the adjacent storage capacitor line and the second data signal line extended section and (ii) cutting a storage capacitor line extended section connected to the adjacent storage capacitor line at a position that does not overlap a pixel electrode; (i) melt-connecting the first data signal line extended section to the predetermined scanning signal line at a position where the first data signal line extended section overlaps the predetermined scanning signal line and (ii) melt-connecting the second data signal line extended section to the predetermined scanning signal line at a position where the second data signal line extended section overlaps the predetermined scanning signal line; and (i) melt-connecting the adjacent storage capacitor line to the first data signal line extended section at position where the adjacent storage capacitor line overlaps the first data signal line extended section and (ii) melt-connecting the adjacent storage capacitor line to the second data signal line extended section at a position where the adjacent storage capacitor line overlaps the second data signal line extended section, a bypass (roundabout route) is formed for the predetermined scanning signal line (scanning signal line where a disconnection occurs). This bypass is made of the first data signal line extended section, a portion cut off from the adjacent storage capacitor line, and the second data signal line extended section. This allows a scanning signal to be transmitted to a section subsequent to the disconnection on the predetermined scanning signal line via the bypass. In the above configuration, no data signal line is cut in correcting a disconnection of a scanning signal line. Therefore, this configuration provides a significant advantage such that an auxiliary line is dispensable for the correction of the disconnection. This configuration also provides an advantage such that the number of positions to be cut is reduced. As described above, in the configuration described above, disconnection of the scanning signal line can be corrected. This makes it possible to improve a process yield in production of the active matrix substrate.

The active matrix substrate of the present invention can be configured to further include: electrodes for correction each electrically connected to a pixel electrode, the electrodes for correction each including an overlap section overlapping the storage capacitor line extended section or a conductive body electrically connected to the storage capacitor line extended section, the storage capacitor line extended section including a section that does not overlap the pixel electrode in a route from a point of connection with the storage capacitor line to the overlap section. When a bypass is formed as described above, a portion of the bypass overlaps a pixel electrode. This causes a capacitance (Cgd) between the pixel electrode and a scanning signal line to become higher than those of other pixel electrodes. In order to solve this problem, an electrode for correction and a storage capacitor electrode extended section are melt-connected in a case where a sub-pixel including the first pixel electrode becomes a bright dot due to an increase in this Cgd. This allows the pixel electrode (the pixel electrode overlapping the bypass) to be electrically connected to a main body of the storage capacitor line. This makes it possible to turn the sub-pixel including the first pixel electrode into a black dot.

The active matrix substrate of the present invention can be configured to further include: transistors each corresponding to a pixel electrode provided in the each pixel area, the transistors each connected to the one scanning signal line. Further, the active matrix substrate of the present invention can also be configured such that: each of the pixel electrodes provided in the each pixel area is connected to one data signal line via a transistor.

The active matrix substrate of the present invention can also be configured such that: the each storage capacitor line extended section is formed along a pixel electrode. This makes it possible to shield an electric field produced by the data signal line, by use of the storage capacitor line extended section.

The active matrix substrate of the present invention can also be configured such that: the scanning signal line is provided with an aperture section reaching inside a pixel area from outside the pixel area. According to the configuration, for example, in a case where a short circuit between a gate and a source (short circuit between a data signal line and a scanning signal line, a short circuit between a scanning signal line and a source electrode of a transistor) occurs, the short circuit can be corrected by cutting a part of the scanning signal line. In this case, the active matrix substrate of the present invention can also be configured such that: a portion of the scanning signal line on each side of the aperture section functions as a gate electrode of the transistor.

An active matrix substrate of the present invention can be described to have a configuration that includes: scanning signal lines extending in a first direction (e.g., a row direction); data signal lines extending in a second direction (e.g., a column direction); storage capacitor lines extending in the first direction; a first data signal line extended section extending from one of two adjacent data signal lines; and a second data signal line extended section extending from another one of the two adjacent data signal lines, the first data signal line extended section and the second data signal line extended section overlapping one scanning signal line, the two adjacent data signal lines intersecting with a storage capacitor line adjacent to the one scanning signal line. In this case, each of the first data signal line extended section and the second data signal line extended section can be configured to intersect with the storage capacitor line adjacent to the one scanning signal line. Further, the active matrix substrate can be configured to further include: storage capacitor electrodes each electrically connected to the storage capacitor line adjacent to the one scanning signal line; and pixel electrodes each forming, with the storage capacitor line, a capacitor, the storage capacitor electrodes each overlapping a pixel electrode. Further, the active matrix substrate can also be configured such that: two storage capacitor lines electrically connected to each other are provided between two adjacent scanning signal lines. Furthermore, the active matrix substrate can be configured to further include: bridging sections each connecting the two storage capacitor lines, the bridging sections being provided so as to form a ladder-like shape. In addition, the active matrix substrate can be configured such that: two pixel electrodes are provided in each pixel area; one of the two pixel electrodes provided in one of two pixel areas adjacent to each other in the second direction forms a capacitor with one of the two storage capacitor lines; and one of the two pixel electrodes provided in another one of the two pixel areas forms a capacitor with another one of the two storage capacitor lines.

A liquid crystal panel of the present invention includes the active matrix substrate described above. A liquid crystal display device of the present invention includes the liquid crystal panel. In addition, a television receiver of the present invention includes: the liquid crystal display device; and a tuner section receiving a television broadcast.

A method of the present invention for producing a liquid crystal panel including an active matrix substrate including: scanning signal lines extending in a first direction; data signal lines extending in a second direction; a plurality of storage capacitor lines extending in the first direction; pixel electrodes in pixel areas each crossed by one scanning signal line, each of the pixel areas including at least one pixel electrode provided on one side of the one scanning signal line and at least one pixel electrode provided on another side of the one scanning signal line, the each pixel area being crossed by one storage capacitor line on one side of the one scanning signal line and by another storage capacitor line on another side of the scanning signal line, the method includes the steps of: forming storage capacitor line extended sections each extending from a position on a storage capacitor line between an intersection of the storage capacitor line and one of two adjacent data signal lines and an intersection of the storage capacitor line and another one of the two adjacent data signal lines, in a manner such that each of the storage capacitor line extended sections includes a section that does not overlap a pixel electrode and that a storage capacitor line extended section extending from one of two adjacent storage capacitor lines that sandwich no scanning signal line and being positioned in a space between the two adjacent data signal lines is connected with another storage capacitor line extended section extending from another one of the two adjacent storage capacitor lines and positioned in the space; on an assumption that one of two storage capacitor lines adjacent to a predetermined scanning signal line is an adjacent storage capacitor line and that one of two scanning signal lines adjacent to the predetermined scanning signal line is an adjacent scanning signal line, the one scanning signal line being positioned on a same side as the adjacent storage capacitor line, forming data signal line extended sections each extending from a position on a data signal line between an intersection of the data signal line and the predetermined scanning signal line and an intersection of the data signal line and the adjacent storage capacitor line, in a manner such that a part of each of the data signal line extended sections overlaps the predetermined scanning signal line; in a case where a disconnection occurs in the predetermined scanning signal line, on an assumption that two data signal lines sandwiching a position of the disconnection are a first data signal line and a second data signal line and that a data signal line extended section extending from the first data signal line is a first data signal line extended section and a data signal line extended section extending from the second data signal line is a second data signal line extended section, (i) cutting the first data signal line at a position between an intersection of the first data signal line and the predetermined scanning signal line and an intersection of the first data signal line and the adjacent storage capacitor line and at a position between an intersection of the first data signal line and the adjacent storage capacitor line and an intersection of the first data signal line and the adjacent scanning signal line and (ii) cutting the second data signal line at a position between an intersection of the second data signal line and the predetermined scanning signal line and an intersection of the second data signal line and the adjacent storage capacitor line and at a position between an intersection of the second data signal line and the adjacent storage capacitor line and an intersection of the second data signal line and the adjacent scanning signal line; (i) cutting off a portion of the adjacent storage capacitor line from an intersection of the adjacent storage capacitor line and the first data signal line to an intersection of the adjacent storage capacitor line and the second data signal line, and (ii) cutting a storage capacitor line extended section extending from the adjacent storage capacitor line at a position that does not overlap a pixel electrode; (i) melt-connecting the first data signal line extended section and the predetermined scanning signal line at a position where the first data signal line extended section overlaps the predetermined scanning signal line and (ii) melt-connecting the second data signal line extended section and the predetermined scanning signal line at a position where the second data signal line extended section overlaps the predetermined scanning signal line; and (i) melt-connecting the first data signal line and the adjacent storage capacitor line at an intersection of the first data signal line and the adjacent storage capacitor line and (ii) melt-connecting the second data signal line and the adjacent storage capacitor line at an intersection of the second data signal line and the adjacent storage capacitor line.

A method of the present invention for producing a liquid crystal panel including an active matrix substrate including: scanning signal lines extending in a first direction; data signal lines extending in a second direction; a plurality of storage capacitor lines extending in the first direction; pixel electrodes in pixel areas each crossed by one scanning signal line, each of the pixel areas including at least one pixel electrode provided on one side of the one scanning signal line and at least one pixel electrode provided on another side of the one scanning signal line, the each pixel area being crossed by one storage capacitor line on one side of the one scanning signal line and by another storage capacitor line on another side of the scanning signal line, the method includes the steps of: forming storage capacitor line extended sections each connecting to a position on a storage capacitor line between an intersection of the storage capacitor line and one of two adjacent data signal lines and an intersection of the storage capacitor line and another one of the two adjacent data signal lines, in a manner such that each of the storage capacitor line extended sections includes a section that does not overlap a pixel electrode and that a storage capacitor line extended section extending from one of two adjacent storage capacitor lines that sandwich no scanning signal line and being positioned in a space between the two adjacent data signal lines is connected with another storage capacitor line extended section extending from another one of the two adjacent storage capacitor lines and positioned in the space; on an assumption that a storage capacitor line adjacent to a predetermined scanning signal line is an adjacent storage capacitor line and that one of two scanning signal lines adjacent to the predetermined scanning signal line is an adjacent scanning signal line, the one scanning signal line being positioned on a same side as the adjacent storage capacitor line, forming data signal line extended sections each extending from a position on a data signal line between an intersection of the data signal line and the adjacent storage capacitor line and an intersection of the data signal line and the adjacent scanning signal line, in a manner such that each of the data signal line extended sections intersects with the adjacent storage capacitor line and a part of the each data signal line extended section overlaps the predetermined scanning signal line; in a case where a disconnection occurs in the predetermined scanning signal line, on an assumption that two data signal lines sandwiching a position of the disconnection are a first data signal line and a second data signal line and that a data signal line extended section extending from the first data signal line is a first data signal line extended section and a data signal line extended section extending from the second data signal line is a second data signal line extended section, (i) cutting the first data signal line extended section at a position between a point connecting the first data signal line extended section with the first data signal line and an intersection of the first data signal line extended section and the adjacent storage capacitor line and (ii) cutting the second data signal line extended section at a position between a point connecting the second data signal line extended section with the second data signal line and an intersection of the second data signal line extended section and the adjacent storage capacitor line; (i) cutting off a portion of the adjacent storage capacitor line from an intersection of the adjacent storage capacitor line and the first data signal line extended section to an intersection of the adjacent storage capacitor line and the second data signal line extended section and (ii) cutting a storage capacitor line extended section connected to the adjacent storage capacitor line at a position that does not overlap a pixel electrode; (i) melt-connecting the first data signal line extended section to the predetermined scanning signal line at a position where the first data signal line extended section overlaps the predetermined scanning signal line and (ii) melt-connecting the second data signal line extended section to the predetermined scanning signal line at a position where the second data signal line extended section overlaps the predetermined scanning signal line; and (i) melt-connecting the adjacent storage capacitor line to the first data signal line extended section at position where the adjacent storage capacitor line overlaps the first data signal line extended section and (ii) melt-connecting the adjacent storage capacitor line to the second data signal line extended section at a position where the adjacent storage capacitor line overlaps the second data signal line extended section.

As described above, in the active matrix substrate of the present invention, a disconnection of a scanning signal line can be corrected. This makes it possible to improve a process yield in production of the active matrix substrate.

Figure 2:
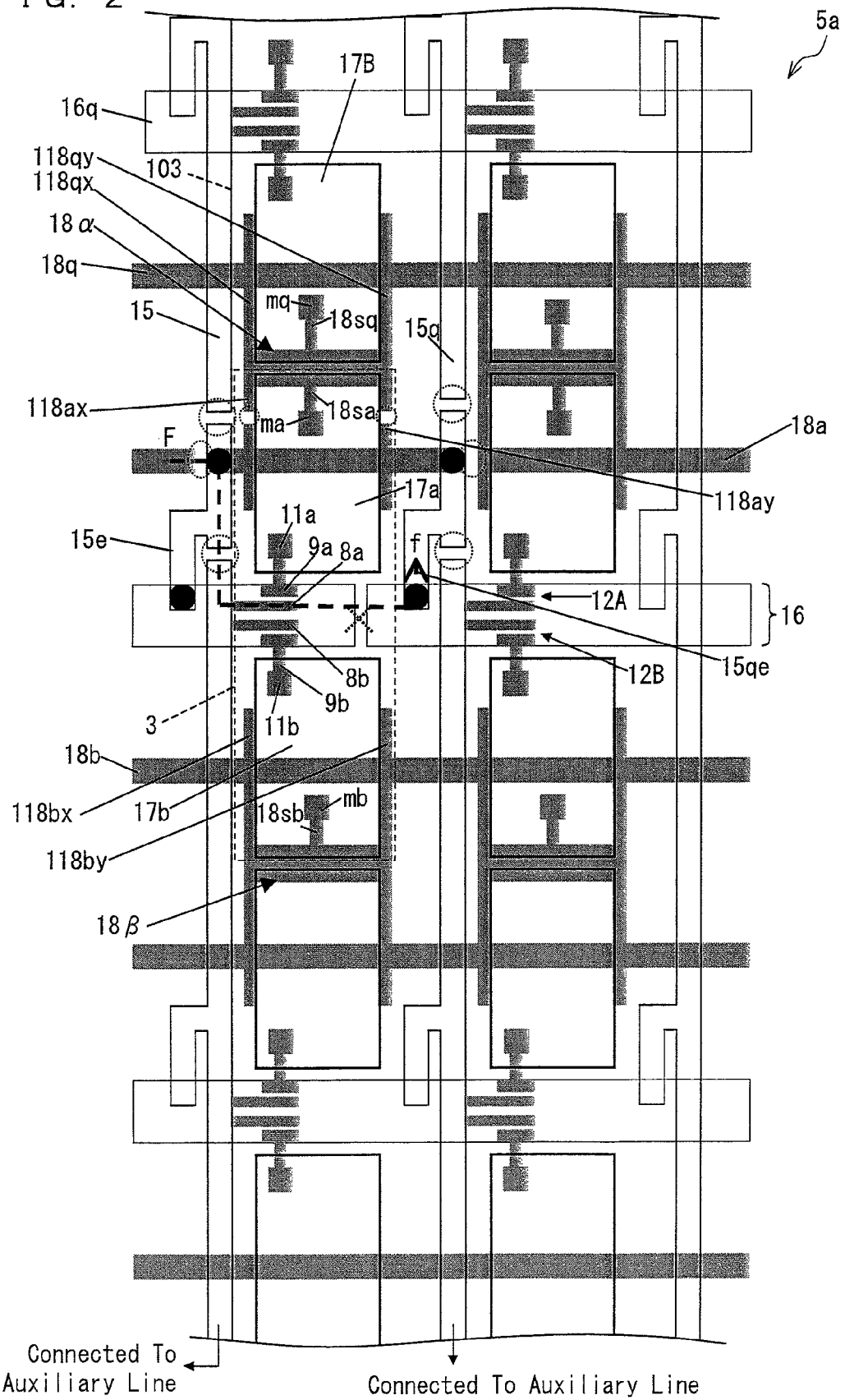
FIG. 2 is a plan view illustrating a state of correction in the active matrix substrate of FIG. 1.
Figure 12:
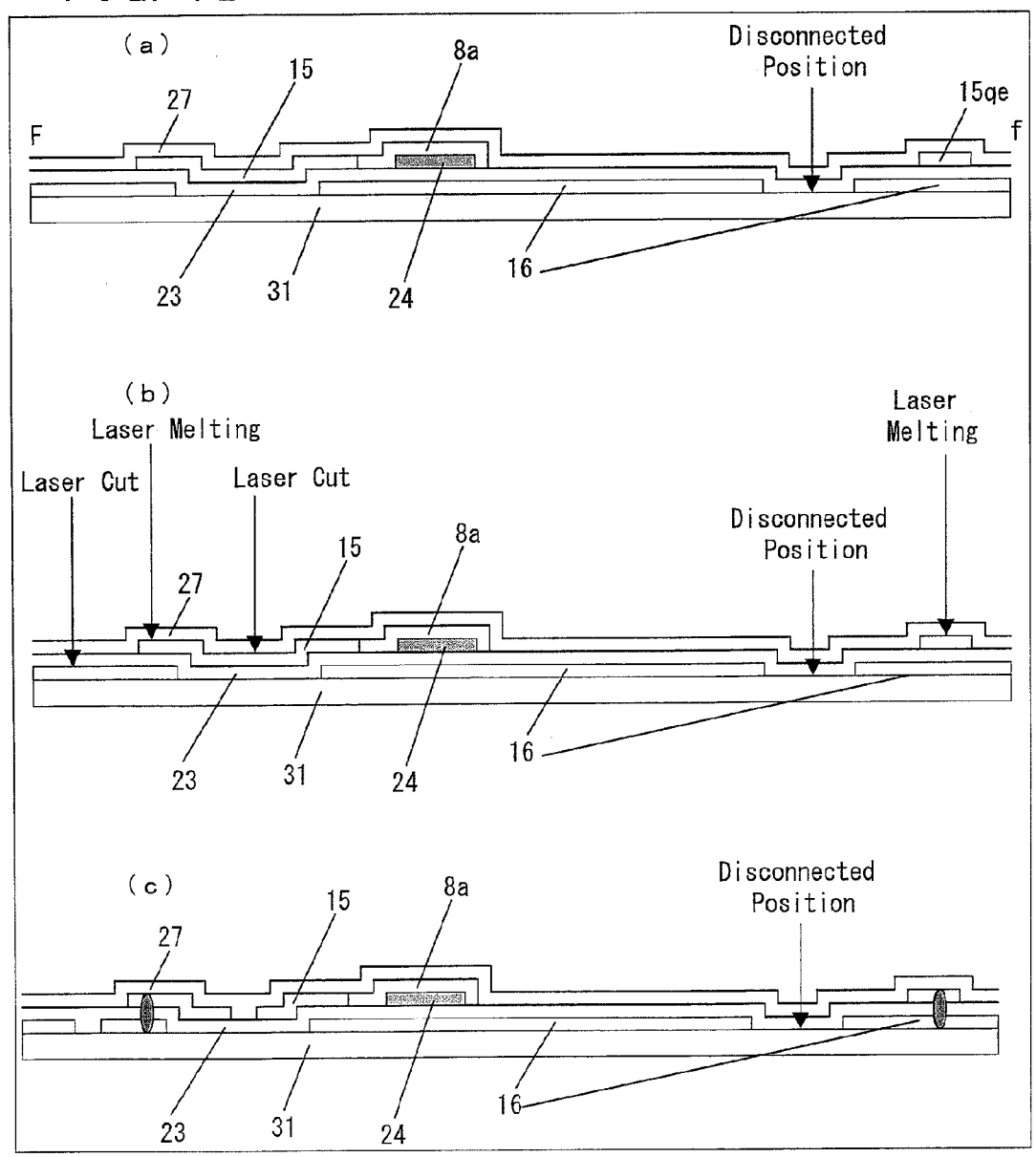

(a) to (c) of FIG. 12 are cross sectional views illustrating a correction process of a section along line F-f of FIG. 2.

Figure 13:
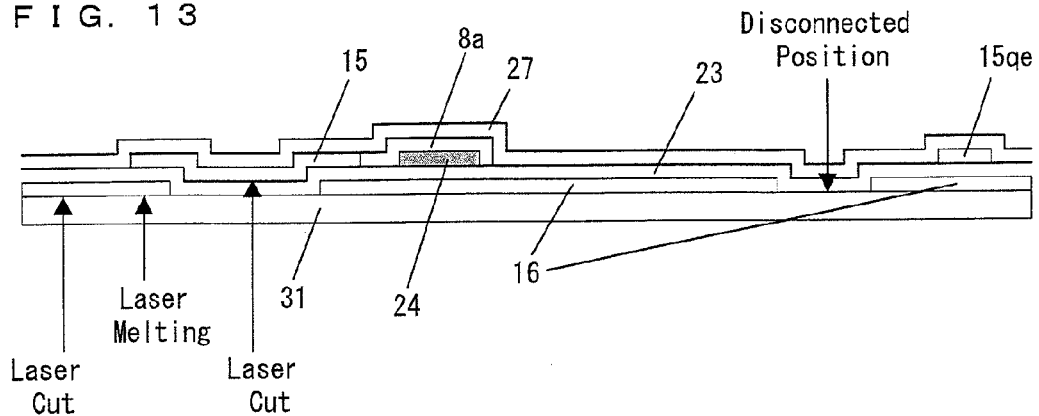

FIG. 13 is a cross sectional view illustrating another correction method of an active matrix substrate of the present invention.

Figure 14:
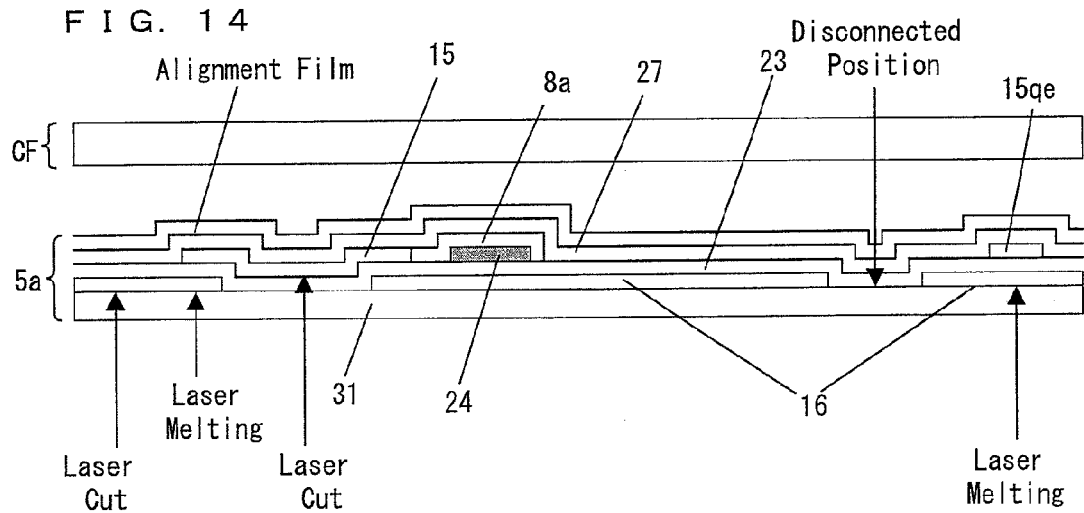

FIG. 14 is a cross sectional view illustrating another correction method of a liquid crystal panel of the present invention.

Figure 5:
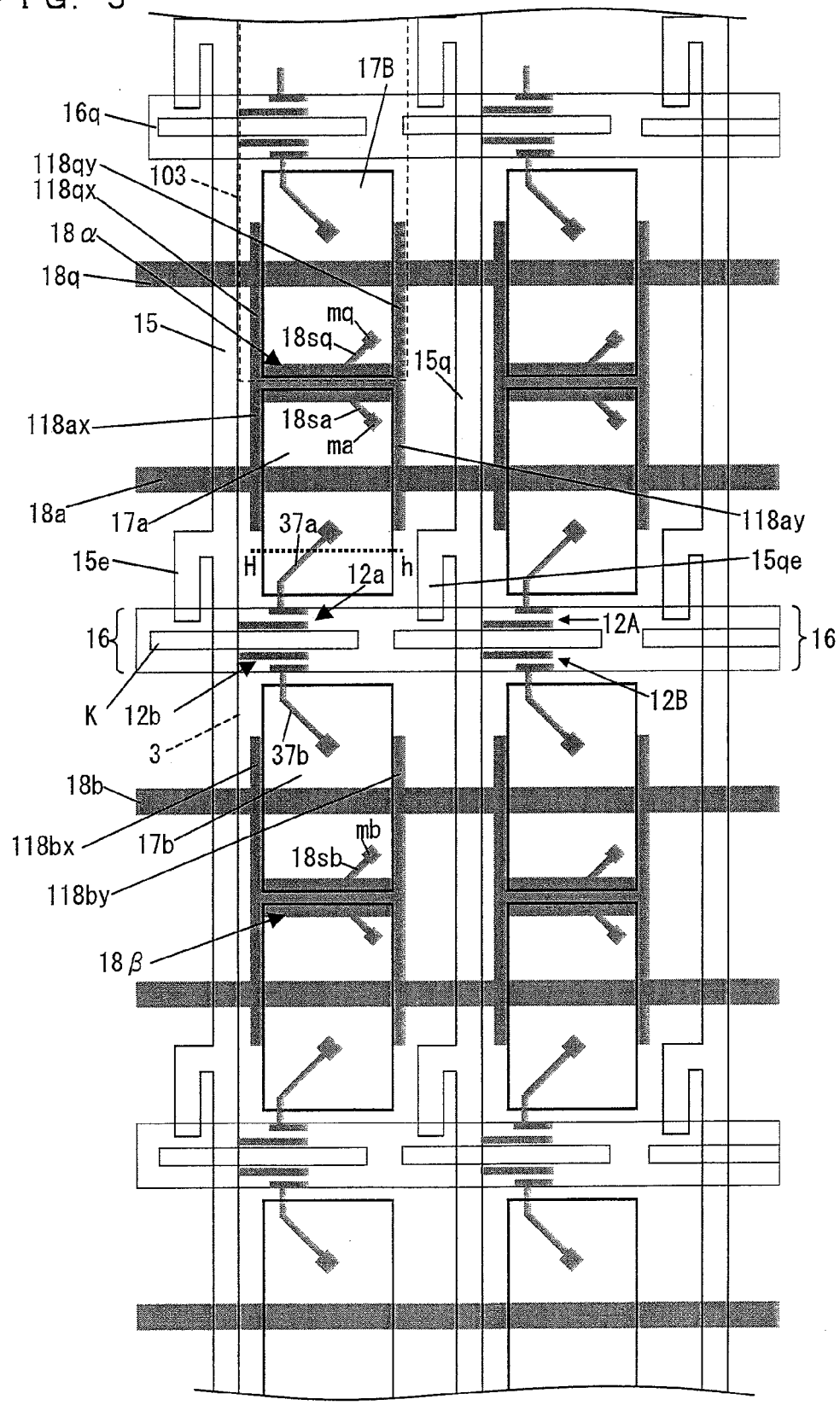
FIG. 5 is a plan view illustrating still another configuration of an active matrix substrate of Embodiment 1.
Figure 15:
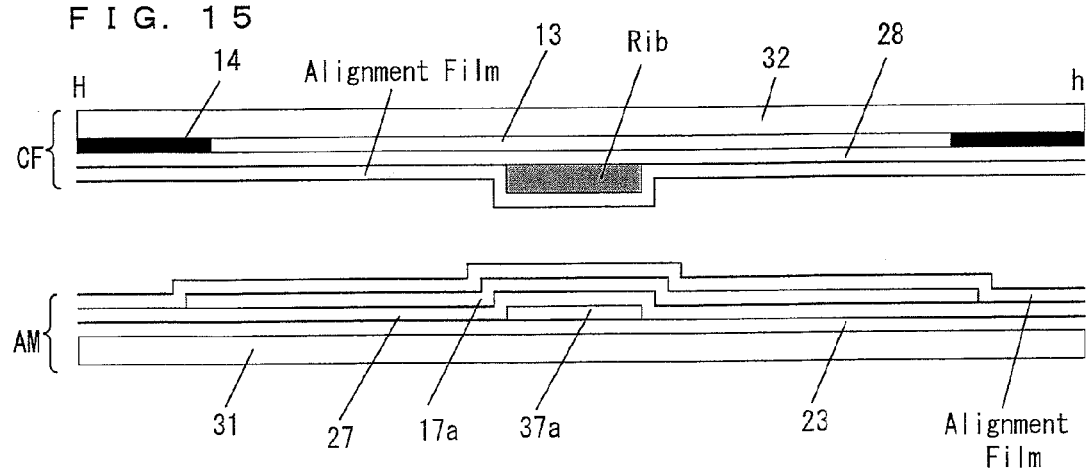

FIG. 15 is a cross sectional view of a liquid crystal panel including the active matrix panel of FIG. 5.

FIG. 16 is a block diagram explaining functions of a liquid crystal display device and a television receiver according to the present invention.

Figure 17:
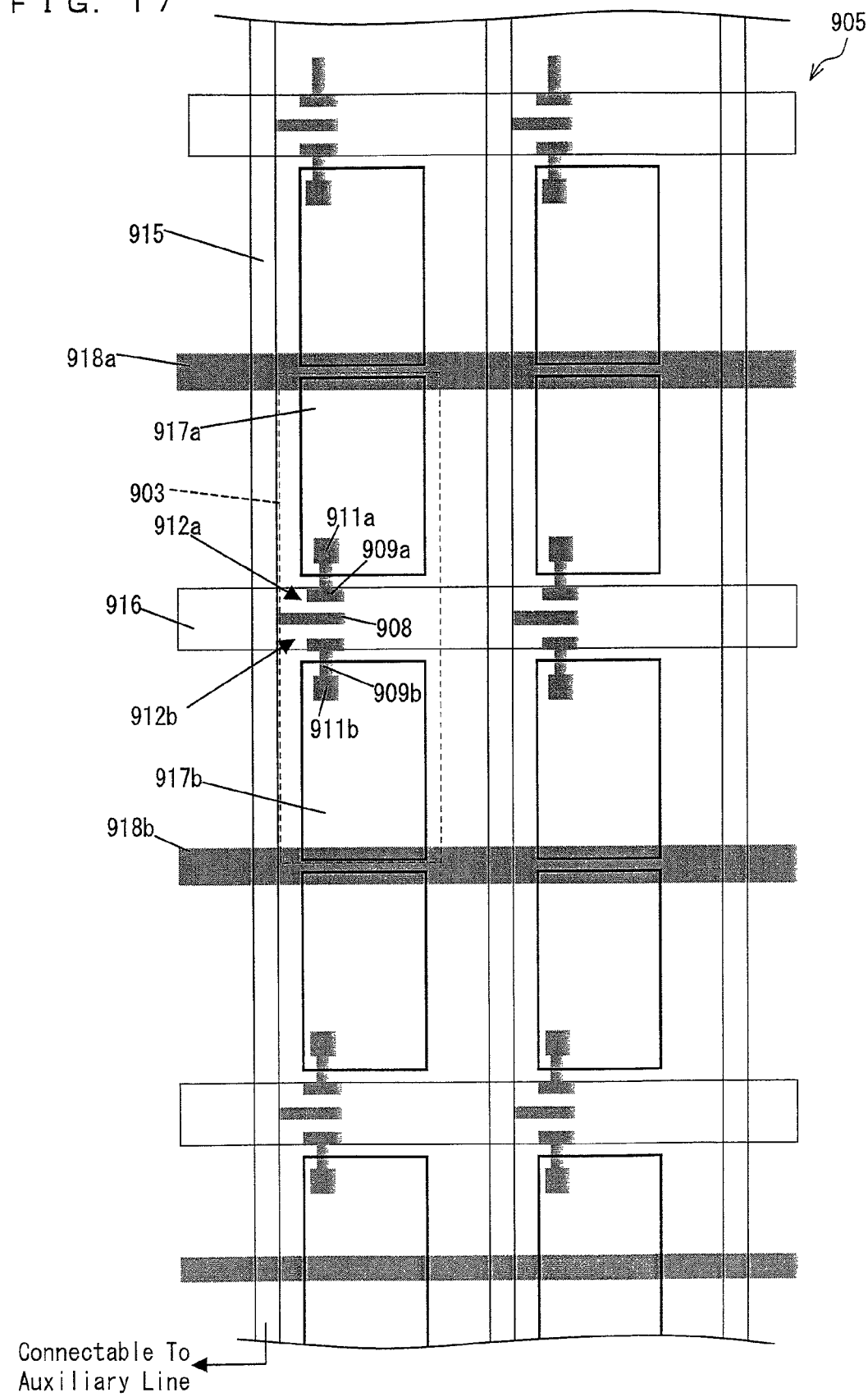

FIG. 17 is a plan view illustrating a configuration of a conventional active matrix substrate.

Figure 18:
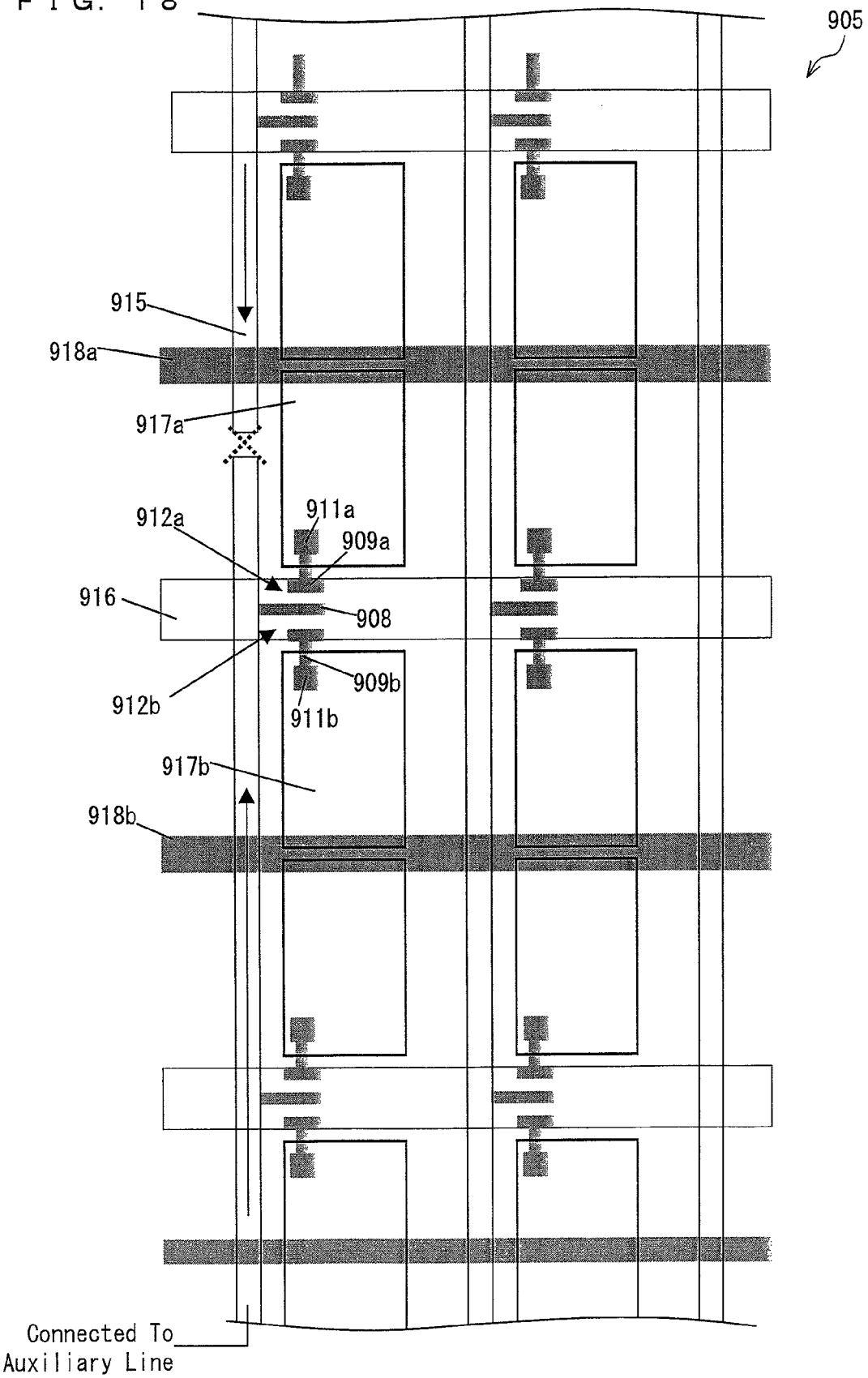

FIG. 18 is a plan view illustrating a state of correction of the conventional active matrix substrate.

REFERENCE SIGNS LIST 3, 103 Pixel Area
5a to 5e Active Matrix Substrate (AM)
12a, 12a First Transistor
12b, 12b Second Transistor
15, 15q Data Signal Line
15e, 15qe Data Signal Line Extended Section
16, 16q Scanning Signal Line
17a First Pixel Electrode
17b, 17B Second Pixel Electrode
18a, 18b, 18q Storage Capacitor Line
18α, 18β Storage Capacitor Electrode
18sa, 18sb, 18sq Storage Capacitor Electrode Extended Section
118ax, 118ay; 118qx, 118qy Storage Capacitor Line Extended Section
CF Color Filter Substrate
K Aperture Section (Of Scanning Signal Line)
70 Liquid Crystal Display Device
80 Television Receiver

DESCRIPTION OF EMBODIMENTS

Embodiments of the present invention are described below. It should be noted that members having identical functions in respective configurations (drawings) are given identical numbers, respectively, and explanations thereof are omitted accordingly.

[Embodiment 1]

Figure 1:
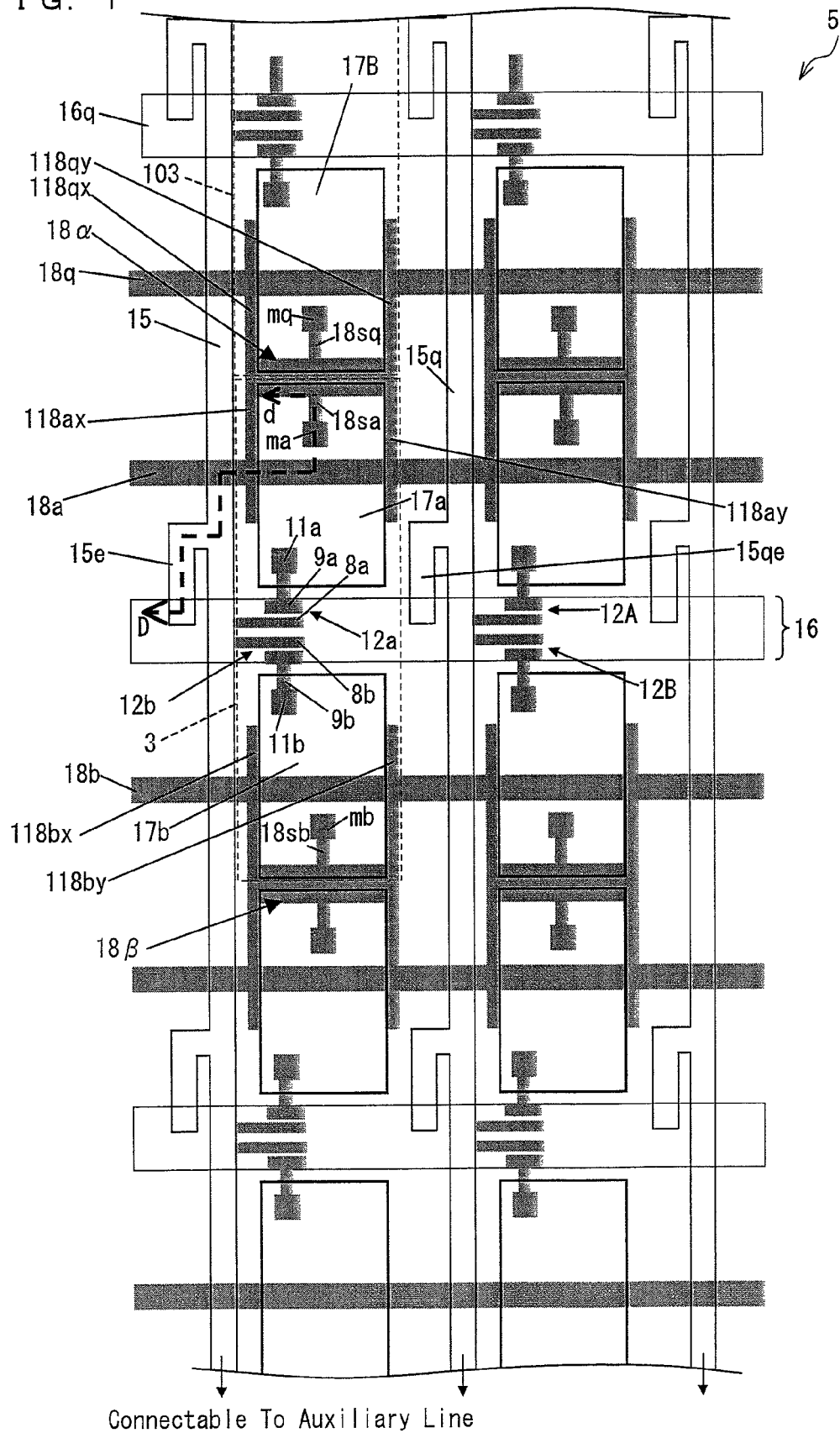
FIG. 1 is a plan view illustrating a configuration of an active matrix substrate of Embodiment 1 of the present invention.

FIG. 1 illustrates a configuration of an active matrix substrate of the present embodiment. The active matrix substrate of the present embodiment in FIG. 1 is an active matrix substrate 5a in a pixel division system. As shown in FIG. 1, this active matrix substrate 5a includes data signal lines (15, 15q) extending in a column direction, scanning signal lines (16, 16a) extending in a row direction, and storage capacitor lines (18a, 18b, 18q) extending in the row direction. In this active matrix substrate 5a, pixel areas 3 are provided in a matrix form. Each of the data signal lines intersects with the storage capacitor lines and the scanning signal lines.

The scanning signal line 16 crosses a center of corresponding pixel areas 3. In a pixel area 3, first and second transistors 12a and 12b and first and second pixel electrodes 17a and 17b are formed. It should be noted that, when viewed in plane, the first pixel electrode 17a and the first storage capacitor line 18a are provided on one side of the scanning signal line 16 and the second pixel electrode 17b and the second storage capacitor line 18b are provided on the other side of the scanning signal line 16.

In the pixel area 3, a source electrode 8a of the first transistor 12a and a source electrode 8b of the second transistor 12b are connected to the data signal line 15. A drain electrode 9a of the first transistor 12a is connected to the first pixel electrode 17a via a contact hole 11a and a drain electrode 9b of the second transistor 12b is connected to the second pixel electrode 17b via a contact hole 11b. Note that the scanning signal line 16 functions as a common gate electrode of the first and second transistors 12a and 12b.

Further, the storage capacitor line 18a overlaps the first pixel electrode 17a, while the storage capacitor line 18b overlaps the second pixel electrode 17b. This forms a first storage capacitor between the storage capacitor line 18a and the first pixel electrode 17a and a second storage capacitor between the storage capacitor line 18b and the second pixel electrode 17b.

In a liquid crystal display device of the present invention including the active matrix substrate 5a, a section corresponding to the pixel area 3 forms one pixel. In the one pixel, a first sub-pixel is formed so as to include the first pixel electrode 17a and a second sub-pixel is formed so as to include the second pixel electrode 17b. According to the liquid crystal display device, though the data signal line 15 supplies an identical signal potential (a potential corresponding to a data signal) to the first and second pixel electrodes 17a and 17b, a potential to the first pixel electrode 17a via the first storage capacitor can be arranged to be different from a potential to the second pixel electrode 17b via the second storage capacitor by separately controlling potentials of the storage capacitor lines 18a and 18b (for example, controlling the potentials so that one of the potentials is pumped up and the other one of the potentials is pumped down).

This makes it possible to express gray levels by configuring one pixel with use of a sub-pixel having a high luminance (bright sub-pixel) and a sub-pixel having a low luminance (dark sub-pixel). This improves dependency of γ characteristic on a viewing angle (e.g., a phenomenon in which a screen appears whitish).

In the active matrix substrate 5a, the data signal lines 15 and 15q are adjacent to each other. Further, the pixel area 3 and a pixel area 103 are adjacent to each other in the column direction. In addition, a scanning signal line 16q crosses the pixel area 103. In the pixel area 103, when viewed in a plane, a first pixel electrode (not shown) is provided on one side of the scanning signal line 16q and a second pixel electrode 17B is provided on the other side of the scanning signal line 16q. The storage capacitor line 18q is provided so as to overlap the second pixel electrode 17B. That is, in the active matrix substrate 5a, two storage capacitor lines are provided between two adjacent scanning signal lines. These two storage capacitor lines are adjacent to each other and does not sandwich a scanning line. For example, the storage capacitor lines 18a and 18q are provided between the scanning signal lines 16 and 16q. These storage capacitor lines 18a and 18q are adjacent to each other and does not sandwich a scanning signal line.

In the pixel area 3, when viewed in a plane, two storage capacitor line extended sections 118ax and 118ay facing each other and an electrode ma for correction are provided on one side of the scanning signal electrode 16. On this one side, the first pixel electrode 17a is provided. On the other hand, two storage capacitor line extended sections 118bx and 118by facing each other and an electrode mb for correction are provided on the other side of the scanning signal line 16. On this other side, the second pixel electrode 17b is provided. Further, in the pixel area 103, when viewed in a plane, two storage capacitor line extended sections 118qx and 118qy facing each other and an electrode mq for correction are provided on one side of the scanning signal electrode 16q. On this one side, the second pixel electrode 17B is provided. In addition, in the active matrix substrate 5a, storage capacitor electrodes 18α and 18β are provided. Each of these storage capacitor electrodes overlaps two pixel electrodes that belong to different pixel areas, respectively and that are adjacent to each other. For example, the storage capacitor electrode 18a overlaps the first pixel electrode 17a of the pixel area 3 and the second pixel electrode 17B of the pixel area 103. Note that, on assumption that the storage capacitor line extended sections 118ax and 118qx form a bridging section and the storage capacitor line extended sections 118ay and 118qy form another bridging section, the bridging sections are provided between the storage capacitor lines 18a and 18q so as to form a ladder-like shape.

The storage capacitor line extended sections 118ax and 118ay extends in the column direction so as to sandwich the first pixel electrode 17a, from respective positions on the storage capacitor line 18a between an intersection of the storage capacitor line 18a and the data signal line 15 that is one of two adjacent data signal lines and an intersection of the storage capacitor line 18a and a data signal line 15q that is the other one of the two adjacent data signal lines. These storage capacitor line extended sections 118ax and 118ay are extended in a direction away from the scanning signal line 16. Similarly, the storage capacitor line extended sections 118bx and 118by extends in the column direction so as to sandwich the second pixel electrode 17b, from respective positions in the storage capacitor line 18b between an intersection of the storage capacitor line 18b and the data signal line 15 that is one of two adjacent data signal lines and an intersection of the storage capacitor line 18b and the data signal line 15q that is the other one of the two adjacent data signal lines. These storage capacitor line extended sections 118bx and 118by are extended in a direction away from the scanning signal line 16. The storage capacitor line extended sections 118qx and 118qy extends in the column direction so as to sandwich a pixel electrode, from respective positions on the storage capacitor line 18q between an intersection of the storage capacitor line 18q and the data signal line 15 that is one of two adjacent data signal lines and an intersection of the storage capacitor line 18q and the data signal line 15q that is the other one of the two adjacent data signal lines. These storage capacitor line extended sections 118qx and 118qy are extended in a direction away from the scanning signal line 16q. The storage capacitor line extended sections 118ax, 118ay, 118bx, 118by, 118qx and 118qy are positioned in a space between two adjacent data signal lines (15 and 15q). Note that each storage capacitor line extended section is provided along an edge of a pixel electrode as described above and has a function to shield an electric field produced by a data signal line.

In the active matrix substrate 5a, two adjacent storage capacitor lines that do not sandwich a scanning signal line are connected to each other in the ladder-like shape. That is, such two storage capacitor lines are connected to each other at respective positions in a space between two adjacent scanning signal lines. More specifically, a storage capacitor line extended section is extended from one of the two storage capacitor lines and provided in a space between two adjacent scanning signal lines while another storage capacitor line extended section is extended from the other one of the two storage capacitor lines and provided in the space.

The storage capacitor line extended section and the another storage capacitor line extended section are connected to each other. Further, from a storage capacitor electrode, a storage capacitor electrode extended section extends and this storage capacitor electrode extended section overlaps an electrode for correction.

For example, the adjacent two storage capacitor lines 18a and 18q are connected to each other in the space between the two adjacent data signal lines. In the space between the data signal lines 15 and 15q, for example, the storage capacitor line extended sections 18ax and 18ay extending from the storage capacitor line 18a are connected to the storage capacitor electrode 18a while the storage capacitor line extended sections 118qx and 118qy extending from the storage capacitor line 18q are connected to the storage capacitor electrode 18a. Further, from the storage capacitor electrode 18a, storage capacitor electrode extended sections 18sa and 18sq are extended in opposite directions (the storage capacitor electrode extended section 18sa extends in a direction approaching the scanning signal line 16; the storage capacitor electrode extended section 18sq extends in a direction approaching the scanning signal line 16q), respectively. An end section of the storage capacitor electrode extended section 18sa overlaps the electrode ma for correction, while an end section of the storage capacitor electrode extended section 18sq overlaps the electrode mq for correction. These electrodes ma and mq for correction are formed in the same layer as the data signal lines. The electrode ma for correction is connected to the first pixel electrode 17a via a contact hole, while the electrode mq for correction is connected to the second pixel electrode 17B via a contact hole.

In the active matrix substrate 5a of the present embodiment, a data signal line extended section extends from a position on the data signal line between (i) an intersection of the data signal line and one of two adjacent scanning signal lines and (ii) an intersection of the data signal line and the other one of the two adjacent scanning signal lines. For example, a data signal line extended section 15e extends from a position on the data signal line 15 between (i) an intersection of the data signal line 15 and the scanning signal line 16 that is one of two adjacent scanning signal lines and (ii) an intersection of the data signal line 15 and the scanning signal line 16q that is the other one of the two adjacent scanning signal lines. More specifically, the data signal line extended section 15e extends from a position on the data signal line 15 between (i) an intersection of the data signal line 15 and the scanning signal line 16 and (ii) an intersection of the data signal line 15 and the storage capacitor line 18a adjacent to the scanning signal line 16. Further, an end section of the data signal line extended section 15e overlaps the scanning signal line 16. Similarly, a data signal line extended section 15qe extends from a position on the data signal line 15q adjacent to the data signal line 15. The position from which data signal line extended section 15qe extends is between (i) an intersection of the data signal line 15q and the scanning signal line 16 that is one of two adjacent scanning signal lines and (ii) an intersection of the data signal line 15q and the data signal line 16q that is the other one of the two adjacent scanning signal lines. More specifically, the data signal line extended section 15qe extends from a position on the data signal line 15q between (i) an intersection of the data signal line 15q and the scanning signal line 16 and (ii) an intersection of the data signal line 15q and the storage capacitor line 18a adjacent to the scanning signal line 16. Further, an end section of the data signal line extended section 15qe overlaps the scanning signal line 16.

Further, the active matrix substrate 5a is provided with an auxiliary line for correcting a disconnection in a data signal line. This auxiliary line is formed, for example, so as to surround a periphery of a display section. When a disconnection of a data signal lines is to be corrected, the auxiliary line is connected to an end of the data signal line on a side that is not for input.

Figure 11:
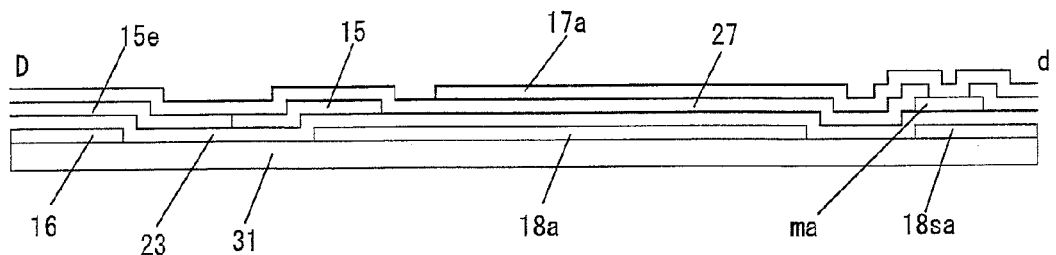
FIG. 11 is a fragmentary cross sectional view taken in the direction of the arrows along line D-d in FIG. 1.

FIG. 11 is a cross sectional view taken along line D-d of FIG. 1. As shown in FIG. 11, in the active matrix substrate 5a of the present embodiment, the scanning signal line 16 and the storage capacitor line 18a are formed on a substrate (transparent insulating substrate) 31. In a layer above the scanning signal line 16 and the storage capacitor line 18a, a gate insulating film 23 is formed. On the gate insulating film 23, the data signal line 15, the data signal line extended section 15e and the electrode ma for correction are formed. In a layer above the data signal line 15, the data signal line extended section 15e and the electrode ma for correction, an interlayer insulating film 27 is formed. The interlayer insulating film 27 is, for example, a passivation film made of an inorganic material. Above the interlayer insulating film 27, the first pixel electrode 17a is formed and an alignment film (not shown) is formed in a layer above the pixel electrode 17a. It should be noted that, as shown in FIG. 11, the electrode ma for correction is connected to the first pixel electrode 17a via the contact hole. Further, the storage capacitor line extended section, the storage capacitor electrode, and the storage capacitor electrode extended section 18sa described above are formed in the same layer as the storage capacitor line 18a.

In the active matrix substrate 5a of the present embodiment or a liquid crystal panel including the active matrix substrate 5a, a disconnection of a scanning signal line can be corrected as shown in FIG. 2. Note that FIG. 2 is a see-through plan view illustrating a case where a disconnection of the scanning signal line 16 occurs between the data signal line 15 and the data signal line 15q. In this case, the data signal line 15 (first data signal line) and the data signal line 15q (second data signal line) are adjacent to each other, and the scanning signal line 16 (predetermined scanning signal line) and the storage capacitor line 18a (adjacent storage capacitor line) are adjacent to each other. Further, among two scanning signal lines adjacent to the scanning signal line 16, the scanning signal line 16q (adjacent scanning signal line) is provided on the same side as the storage capacitor line 18a.

First, the storage capacitor line 18a is cut at both ends (two positions) of a portion from (i) an intersection of the storage capacitor line 18a and the data signal line 15 and (ii) an intersection of the storage capacitor line 18a and the data signal line 15q so that the above portion is electrically cut off from a main body of the storage capacitor line 18a. Further, each of the storage capacitor line extended sections 118ax and 118ay connected to the storage capacitor line 18a is cut.

Then, each of the data signal lines 15 and 15q is cut between (i) an intersection of the data signal line 15 or 15q and the scanning signal line 16 and (ii) an intersection of the data signal line 15 or 15q and the storage capacitor line 18a. In addition, each of the data signal lines 15 and 15q is cut between (i) an intersection of the data signal line 15 or 15q and the storage capacitor line 18a and (ii) an intersection of the data signal line 15 or 15q and the scanning signal line 16q.

Further, the data signal line extended section 15e and the scanning signal line 16 are melt-connected at a section (a black circle in FIG. 2) where the data signal line extended section 15e and the scanning signal line overlap. Further, the data signal line extended section 15qe and the scanning signal line 16 are melt-connected at a section (a black circle in FIG. 2) where the data signal line extended section 15qe and the scanning signal line 16 overlap.

Then, the data signal line 15 and the storage capacitor line 18a are melt-connected at an intersection (a black circle in FIG. 2) of the data signal line 15 and the storage capacitor line 18a. Further, the data signal line 15q and the storage capacitor line 18a are melt-connected at an intersection (a black circle in FIG. 2) of the data signal line 15q and the storage capacitor line 18a.

Subsequently, an end of the data signal line 15 on a side that is not for input is connected to a predetermined auxiliary line, while an end of the data signal line 15q on a side that is not for input is connected to another auxiliary line.

This forms, for the scanning signal line 16 where the disconnection occurs, a bypass (roundabout route) is formed. This bypass is made of the data signal line extended section 15e, a portion cut off from the data signal line 15, a portion cut off from the storage capacitor line 18a, a portion cut off from the data signal line 15q, and the data signal line extended section 15qe. In other words, a scanning signal is transmitted to a section subsequent to a position of the disconnection of the scanning signal line 16 via the bypass, and a signal potential (a potential corresponding to a data signal) can be supplied to a section subsequent to the cut positions on a downstream side of each of the data signal lines 15 and 15q via the auxiliary line.

In this way, in the active matrix substrate 5a of the present embodiment, a signal potential can be supplied to the transistors 12a and 12b that are connected to the cut data signal line 15 and the scanning signal line 16 where the disconnection occurs. Further, a signal potential can also be supplied to the transistors 12A and 12B that are connected to this scanning signal line 16 and the cut data signal line 15q. Therefore, it is possible to correct the disconnection of the scanning signal line 16 while no defective pixel is produced. In other words, according to the active matrix substrate 5a, a disconnection of a scanning signal line can be corrected. This makes it possible to improve a process yield in production.

Note that, when the bypass is formed, a capacitance (Cgd) between the scanning signal line 16 and the first pixel electrode 17a that is connected to the transistor 12a becomes higher than those of other pixel electrodes. In order to solve this problem, the electrode ma for correction and the storage capacitor electrode extended section 18sa are melt-connected in a case where a sub-pixel including the first pixel electrode 17a becomes a bright dot due to an increase in the Cgd. This allows the first pixel electrode 17a to be electrically connected to the storage capacitor line 18q (and a main body of the storage capacitor line 18a). This makes it possible to turn the sub-pixel including the first pixel electrode 17a into a black dot.

(a) to (c) of FIG. 12 are fragmentary cross sectional views illustrating a correction process of a section taken in the direction of an arrow along line F-f of FIG. 2. Note that: (a) of FIG. 12 shows a state prior to correction; (b) of FIG. 12 shows a state during the correction; and (c) of FIG. 12 shows a state after the correction. Further, in (a) of FIG. 12, the scanning signal line 16 is formed on the substrate (transparent insulating substrate) 31, and the insulating film 23 is formed in a layer above the scanning signal line 16. On the gate insulating film 23, a semiconductor layer 24, the data signal line 15 and the drain electrode 8a are formed. In a layer above the semiconductor layer 24, the data signal line 15 and the drain electrode 8a, the interlayer insulating film 27 (passivation film) is formed. In the present embodiment, as shown in (b) of FIG. 12, a (breakage) cut and a melt connection are made by laser irradiation through a surface of the active matrix substrate, for example. A laser to be used is not specifically limited, and for example, YAG (Yttrium Aluminum Garnet) laser may be used. An example of a wavelength to be used is the fourth harmonic (wavelength of 266 nm) of the YAG laser. Note that, at the (breakage) cut and the melt-connection, laser irradiation may be carried out through a back surface of the active matrix substrate as shown in FIG. 13.

The following explains an example of a method for producing the active matrix substrate of the present invention.

First, on a transparent insulating substrate made of, for example, glass or plastic, a film is formed by a method such as sputtering so that a film thickness is in a range of 1000 Å to 3000 Å. The film is a metal film made of, for example, titanium, chromium, aluminum, molybdenum, tantalum, tungsten, or copper, an alloy film made of a combination of these metals, or laminated layers of metal and/or alloy films of these metals. Thus obtained film is patterned into a required shape by a photo-etching method so that, for example, scanning signal lines (that function as gate electrodes of respective transistors), storage capacitor lines, storage capacitor line extended sections, storage capacitor electrodes, and storage capacitor electrode extended sections are formed.

The next step is to successively form, by a method such as plasma CVD (Chemical vapor deposition), a silicon nitride film (SiNx) that becomes a gate insulating film, a high-resistance semiconductor layer made of, for example, amorphous silicon or a polysilicon, and a low-resistance semiconductor layer made of, for example n+ amorphous silicon. Thus obtained film and layers are patterned by a photo-etching method. Note that: the silicon nitride film as the gate insulating film is arranged to have a film thickness, for example, in a range of approximately 3000 Å to 5000 Å; an amorphous silicon film as the high-resistance semiconductor layer is arranged to have a film thickness, for example, in a range of approximately 1000 Å to 3000 Å; and an n+ amorphous silicon film as the low-resistance semiconductor layer is arranged to have a film thickness, for example, in a range of approximately 400 Å to 700 Å.

Then, a film is further formed by a method such as sputtering so that a film thickness of the film is in arrange of 1000 Å to 3000 Å. The film is a metal film made of, for example, titanium, chromium, aluminum, molybdenum, tantalum, tungsten, or copper, an alloy made of a combination of these metals, or laminated layers of metal and/or alloy films of these metals. Then, the film is formed into a required pattern by photo-etching or the like. Thereby, data signal lines, source electrodes, drain electrodes, data signal line extended sections, electrodes for correction, and the like are formed.

Next, channel etching is performed in dry etching on the high-resistance semiconductor layer (i layer) such as an amorphous silicon film and the low-resistance semiconductor layer (n+ layer) such as an n+ amorphous silicon film, while patterns of the data signal lines, the source electrodes, the drain electrodes, the data signal line extended sections, the electrodes for correction and the like are used as a mask. In this process, a film thickness of the i layer is optimized and each transistor (channel region) is formed. In this process, a semiconductor layer that is not covered by the mask is removed by etching and the i layer of a film thickness necessary for performance of each transistor is left.

Then, an inorganic insulating film made of, for example, silicon nitride or silicon oxide is formed as an interlayer insulating film, so as to cover the data signal lines, the source electrodes, the drain electrodes, the data signal line extended section, the electrodes for correction and the like. Here, a silicon nitride film (passivation film) is formed by plasma CVD or the like so as to have a film thickness in a range of approximately 2000 Å to 5000 Å.

Then, in accordance with positions of contact holes, holes are formed by etching the interlayer insulating film. Here, for example, a photosensitive resist is patterned by a photolithography method (exposure and development) and the etching is performed.

Then, on the interlayer insulating film, a film is formed by sputtering or the like at a film thickness in a range of approximately 1000 Å to 2000 Å. This film is a conductive film that is made of, for example, ITO (Indium Tin Oxide), IZO, zinc oxide, or tin oxide and that has transparency. Thus formed film is patterned into a required shape by photo-etching or the like so that first and second pixel electrodes are formed in each pixel area.

Subsequently, an alignment film is applied by an inkjet method or the like so as to cover the pixel electrodes.

Then, the active matrix substrate is checked. That is, presence of a disconnection in scanning signal lines is checked. In a case where a disconnection is found, the disconnection is corrected as shown in FIG. 2 and (a) to (c) of FIG. 12. As a result, the active matrix substrate of the present invention is produced.

Further, the active matrix substrate of the present invention is bonded to a color filter substrate and liquid crystals are filled and sealed. As a result, a liquid crystal panel of the present invention is produced. Note that the color filter substrate is obtained by: forming, on a transparent insulating substrate, color layers (RGB) and a black matrix provided in a space between the color layers; forming a counter electrode (common electrode) in a layer above the color layers and the black matrix; and forming an alignment film in a layer above the counter electrode.

The presence of the disconnection in the scanning signal lines may be checked by using the active matrix substrate or alternatively a complete liquid crystal panel. In a case where the complete liquid crystal panel is used for the check, display is performed after a source driver and a gate driver are connected or mounted. If any disconnection is found in such a case, correction of the disconnection is performed by laser irradiation through a back surface of the liquid crystal panel (transparent insulating substrate side of the active matrix substrate), as shown in FIG. 14.

Figure 3:
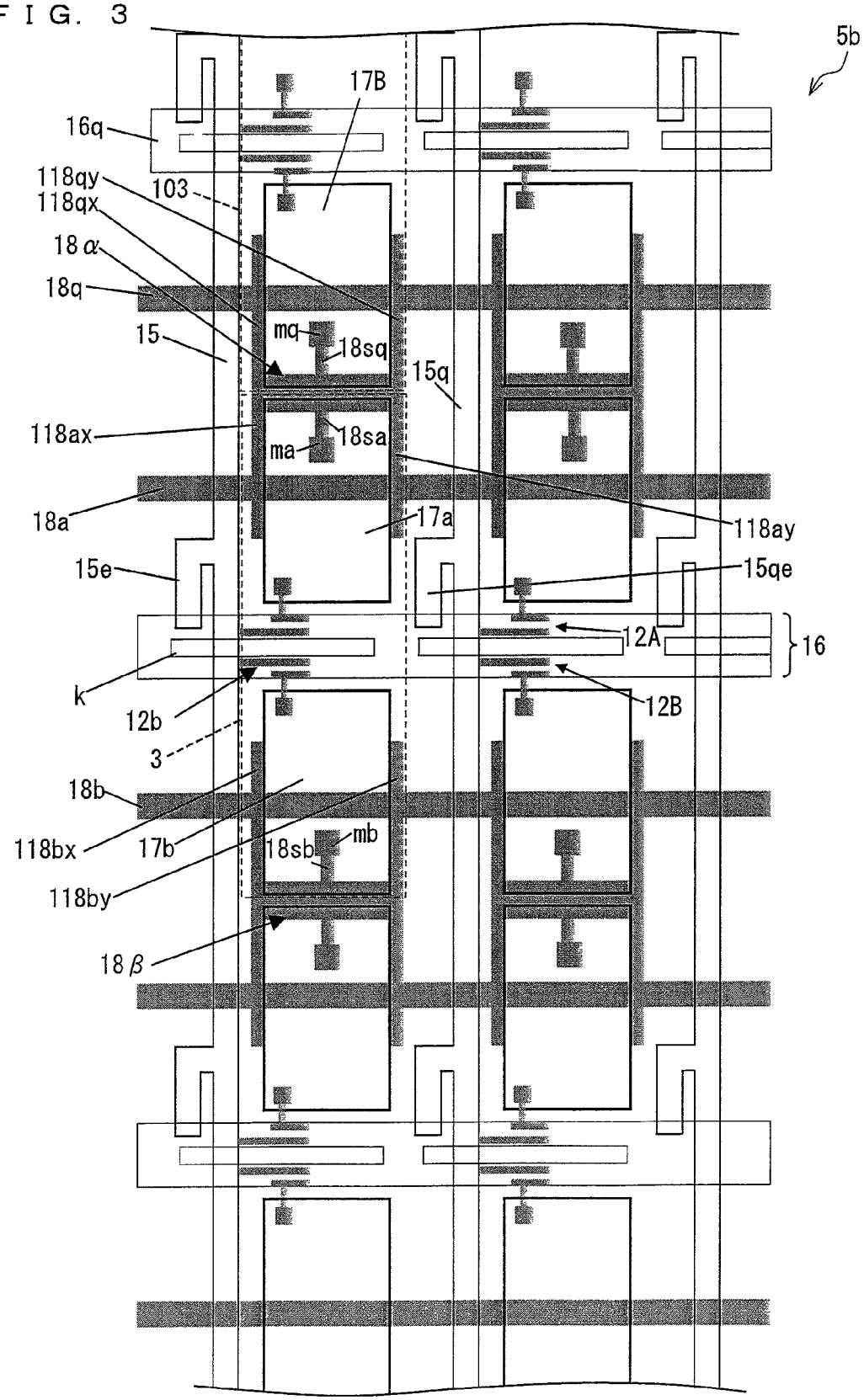
FIG. 3 is a plan view illustrating another configuration of an active matrix substrate of Embodiment 1.

The active matrix substrate of the present invention may be configured as shown in FIG. 3. In an active matrix substrate 5b shown in FIG. 3, an aperture section is formed in each scanning signal line. This aperture section reaches inside a pixel area from outside the pixel area. Portions of each scanning signal line on respective sides of the aperture section function as gate electrodes for respective transistors. For example, in the scanning signal line 16, an aperture section K is formed so as to reach inside a pixel area 3 from outside the pixel area. Portions of the scanning signal line 16 on respective sides of the aperture section K function as respective gate electrodes of transistors 12a and 12b. Note that other configuration of the active matrix substrate 5b is the same as that of the active matrix substrate 5a (See FIG. 1).

Figure 4:
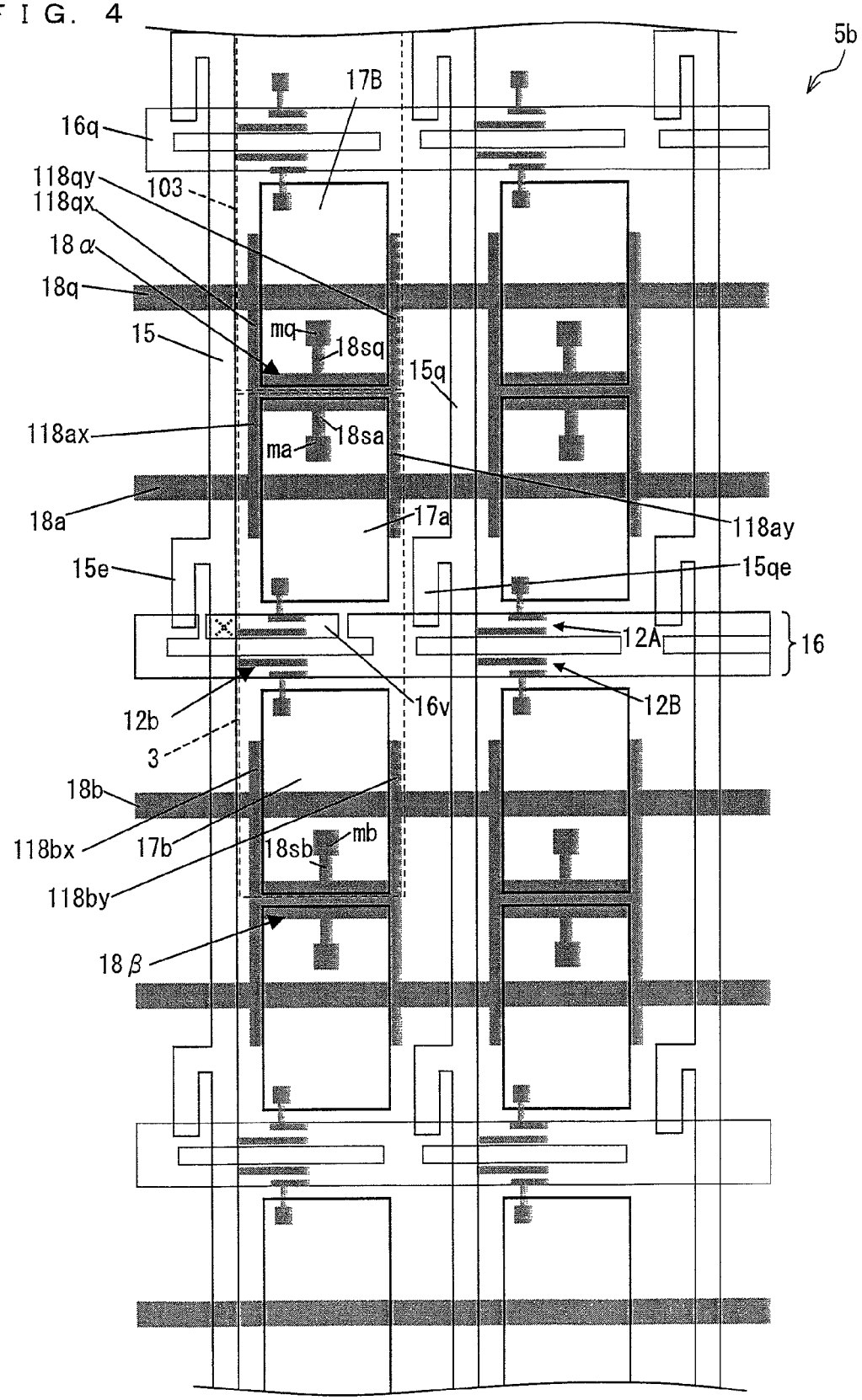
FIG. 4 is a plan view illustrating a state of correction in the active matrix substrate of FIG. 3.

According to the active matrix substrate 5b, for example, in a case where a short circuit between a gate and a source (short circuit between a data signal line and a scanning signal line, a short circuit between a scanning signal line and a source electrode of a transistor) occurs, the short circuit can be corrected by cutting a part of the scanning signal line. For example, in a case where the data signal line 15 and the scanning signal line 16 are short-circuited, a portion including a short-circuited section (16v) of the scanning signal line 16 is cut off from a main body of the scanning signal line 16, as shown in FIG. 4, and an electrode ma for correction and a storage capacitor electrode extended section 18sa are melt-connected. This can correct the short circuit between the gate and the source and turn a sub-pixel including a first pixel electrode 17a into a black dot.

Further, the active matrix substrate 5b can be modified as shown in FIG. 5. That is, drain lead wires 37a and 37b each extended from a drain electrode, storage capacitor electrode extended lines 18sa, 18sb, and 18sq, electrodes ma, mb, and mq for correction, or the like are overlapped on alignment control structures, such as ribs (light-shielding protrusions provided on a color filter substrate) used in a multi-domain mode (e.g., MVA mode). Other configuration of thus modified active matrix substrate 5b is the same as that of the active matrix substrate 5b. FIG. 15 is a cross sectional view taken along line H-h of FIG. 5 in a liquid crystal panel including an active matrix substrate AM of FIG. 5. In the color filter substrate CF of the liquid crystal panel, color layers (R, G, and B) 13 and a black matrix 14 provided in a space between the color layers are formed on a transparent insulating substrate 32. In a layer above the color layers 13 and the black matrix 14, a counter electrode (common electrode) 28 is formed. In a layer above the counter electrode 28, ribs are formed. Then, an alignment film is formed so as to cover the counter electrode 28 and the ribs. As shown in FIG. 15, by overlapping light-shielding members and/or overlapping light-shielding members on a region that does not contribute to alignment, a substantial pixel aperture ratio can be improved.

Figure 6:
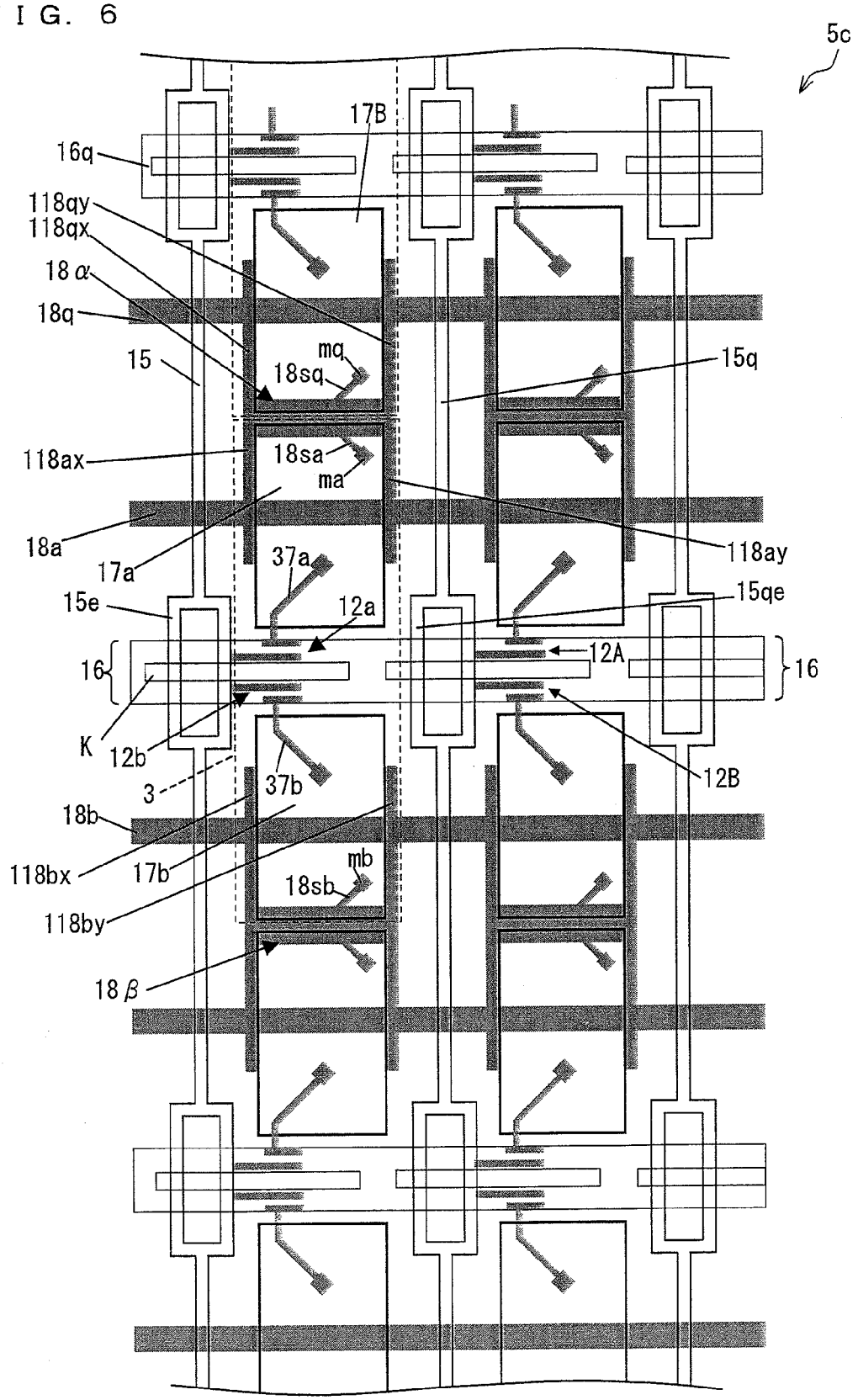
FIG. 6 is a plan view illustrating yet another configuration of an active matrix substrate of Embodiment 1.
Figure 7:
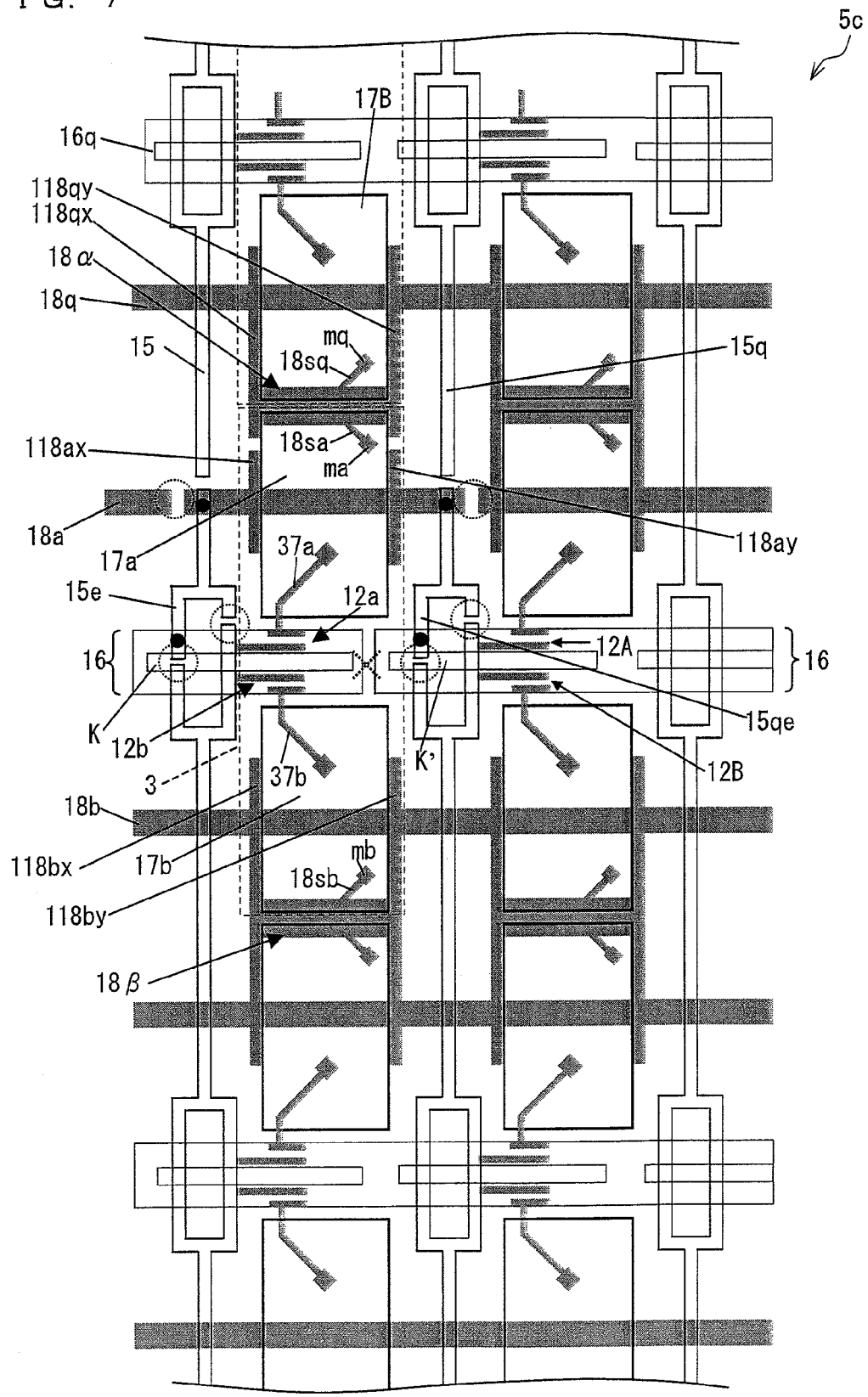
FIG. 7 is a plan view illustrating a state of correction in the active matrix substrate of FIG. 6.

In addition, the active matrix substrate of the present invention, that is, an active matrix substrate 5c, can be configured as shown in FIG. 6. The active matrix substrate 5c of FIG. 6 includes a bypass-type data signal line extended section. Specifically, this data signal line extended section is configured to reach from one side of a scanning signal line to the other by straddling the scanning signal line. In the present configuration, the data signal line extended section is arranged to pass above an aperture section formed in the scanning signal line. Other configuration of the active matrix substrate 5c is the same as that of the active matrix substrate 5b. In the active matrix substrate 5c or a liquid crystal panel including the active matrix substrate 5c, a disconnection of a scanning signal line can be corrected as shown in FIG. 7. As shown in FIG. 7, in a case where a disconnection occurs in the scanning signal line 16 between a data signal line 15 and a data signal line 15q, the correction may be performed by cutting a data signal line extended section 15e in an aperture section K and cutting a data signal line extended section 15qe in an aperture section K' in addition to the correction (cut and melt-connection) at the positions shown in FIG. 2.

[Embodiment 2]

Figure 8:
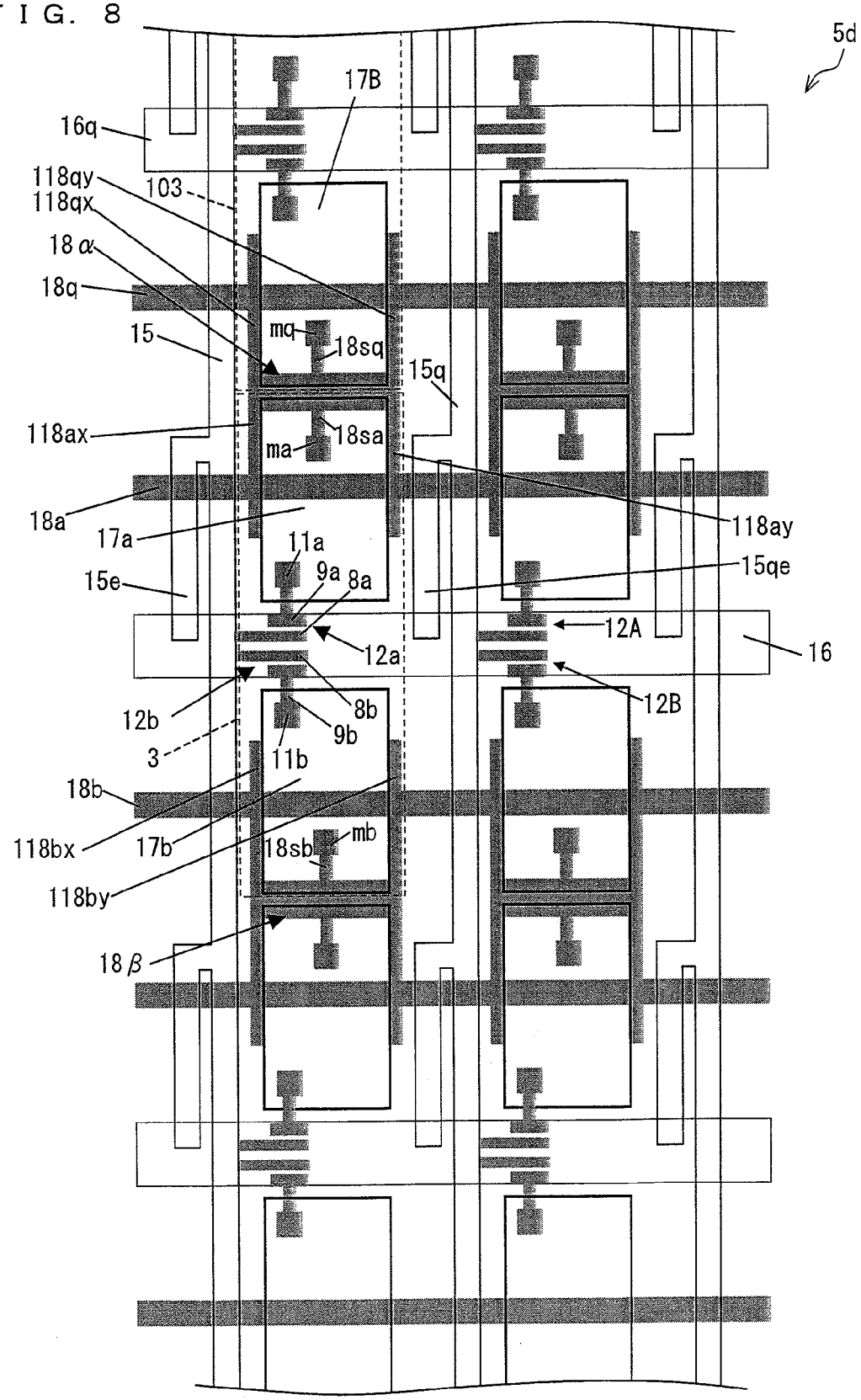
FIG. 8 is a plan view illustrating a configuration of an active matrix substrate of Embodiment 2 of the present invention.

An active matrix substrate of the present embodiment, that is, an active matrix substrate 5d can be configured as shown in FIG. 8. The active matrix substrate 5d has a configuration that makes it possible to correct a scanning signal line by using no auxiliary line. In the active matrix substrate 5d, a data signal line extended section extends from a position on a data signal line between (i) an intersection of the data signal line and one of two adjacent scanning signal lines and (ii) an intersection of the data signal line and the other one of the two adjacent scanning signal lines. One of two storage capacitor lines adjacent to a scanning signal line which the data signal line extended section overlaps is defined as an adjacent storage capacitor line. Further, out of two scanning signal lines adjacent to the scanning signal line which the data signal line extended section overlaps, one scanning signal line provided on the same side as the adjacent storage capacitor line is defined as an adjacent scanning signal line. In this case, the data signal line extended section extends from a position on the data signal line between (i) an intersection of the data signal line and the adjacent storage capacitor line and (ii) an intersection of the data signal line and the adjacent scanning signal line, and intersects with the adjacent storage capacitor line. Other configuration of the active matrix substrate 5d is the same as that of the active matrix substrate 5a (See FIG. 1).

For example, in the active matrix substrate 5d, data signal lines 15 and 15q are adjacent to each other. Further, a scanning signal line 16 and a storage capacitor line 18a (adjacent storage capacitor line) are adjacent to each other. Out of two scanning lines adjacent to the scanning signal line 16, one scanning signal line (adjacent scanning signal line) provided on the same side as the adjacent storage capacitor line 18 is a scanning signal line 16q. A data signal line extended section 15e extends from a position on the data signal line 15 between (i) an intersection of the data signal line 15 and the storage capacitor line 18a and (ii) an intersection of the data signal line 15 and the scanning signal line 16q. The data signal line extended section 15e intersects with the storage capacitor line 18a and has an end overlapping the scanning signal line 16. Further, a data signal line extended section 15qe extends from a position on the data signal line 15q between (i) an intersection of the data signal line 15q and the storage capacitor line 18a and (ii) an intersection of the data signal line 15q and the scanning signal line 16q. The data signal line extended section 15qe intersects with the storage capacitor line 18a and has an end overlapping the scanning signal line 16.

Figure 9:
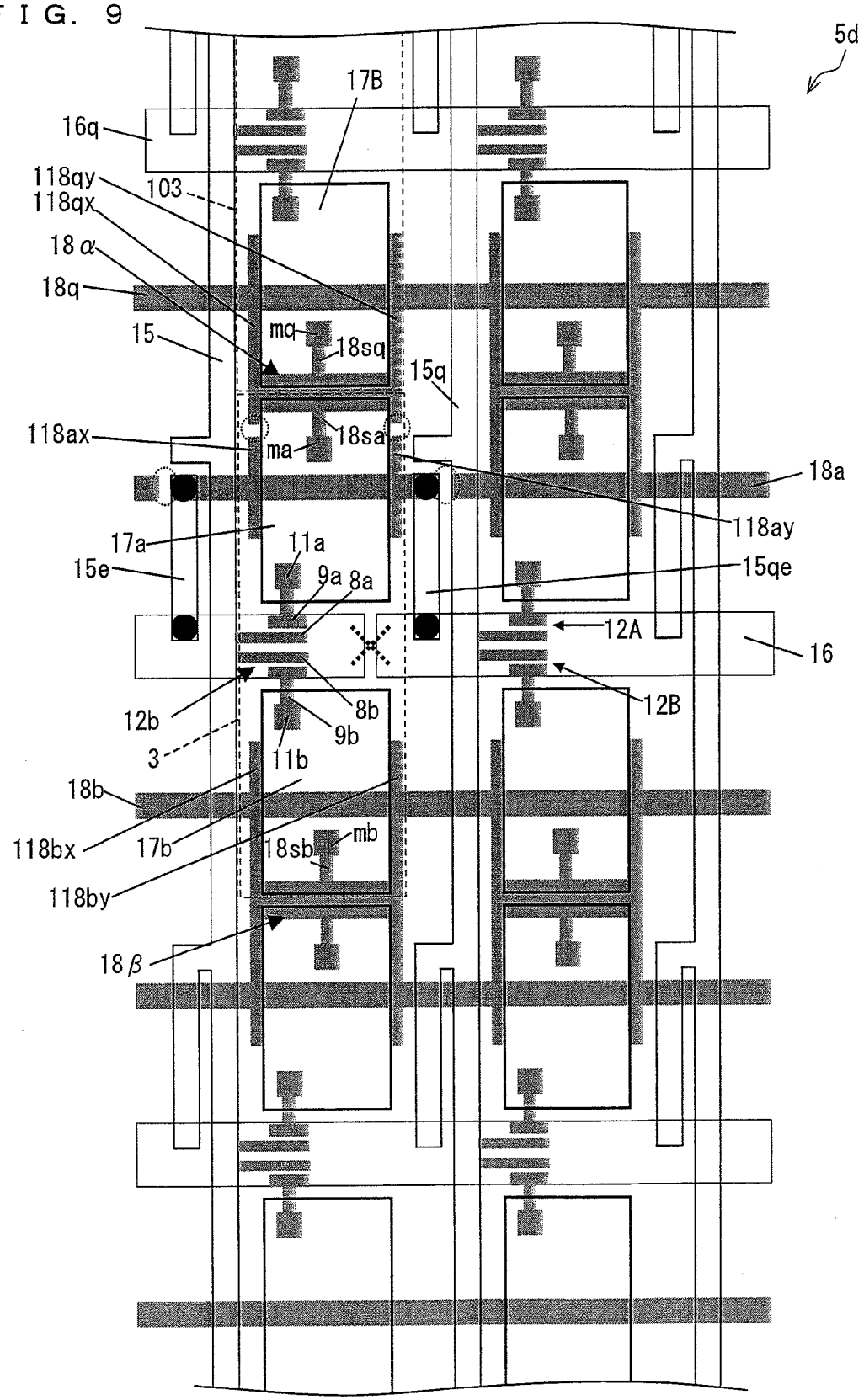
FIG. 9 is a plan view illustrating a state of correction in the active matrix substrate of FIG. 8.

Regarding the active matrix substrate 5d or a liquid crystal panel including the active matrix substrate 5d, a disconnection of a scanning signal line can be corrected as shown in FIG. 9. Note that FIG. 9 is a see-through plan view illustrating a case where a disconnection of the scanning signal line 16 occurs between the data signal line 15 and the data signal line 15q. The data signal line 15 (first data signal line) and the data signal line 15q (second data signal line) are adjacent to each other, and the scanning signal line 16 (predetermined scanning signal line) and the storage capacitor line 18a (adjacent storage capacitor line) are adjacent to each other. Out of the two scanning signal lines adjacent to the scanning signal line 16, one scanning signal line provided on the same side as the storage capacitor line 18a is the scanning signal line 16q (adjacent scanning signal line).

First, for electrically cutting off, from a main body of the storage capacitor line 18a, a portion of the storage capacitor line 18a from an intersection of the storage capacitor line 18a and the data signal line extended section 15e to an intersection of the storage capacitor line 18a and the data signal line extended section 15qe, the storage capacitor line 18a is cut at both ends (two positions) of the above portion. Further, each of storage capacitor line extended sections 118ax and 118ay connected to the storage capacitor line 18a is cut.

Then, the data signal line extended section 15e is cut at a point of connection with the data signal line 15 (a root of the data signal line extended section 15e) and at an intersection with the storage capacitor line 18a. Further, the data signal line extended section 15qe is cut at a point of connection with the data signal line 15q (a root of the data signal line 15qe) and at an intersection with the storage capacitor line 18a.

Further, the data signal line extended section 15e and the scanning signal line 16 are melt-connected at a section where the data signal line extended section 15e and the scanning signal line 16 overlap, while the data signal line extended section 15qe and the scanning signal line 16 are melt-connected at a section where the data signal line extended section 15qe and the scanning signal line 16 overlap.

In addition, the data signal line extended section 15e and the storage capacitor line 18a are melt-connected at an intersection of the data signal line extended section 15e and the storage capacitor line 18a, while the data signal line extended section 15qe and the storage capacitor line 18a are melt-connected at an intersection of the data signal line extended section 15qe and the storage capacitor line 18a.

This forms a bypass (a roundabout route) made of the data signal line extended section 15e, a portion of the storage capacitor line 18a cut off from the storage capacitor line 18a, and the data signal line extended section 15qe. Via the bypass, a scanning signal is transmitted to a section subsequent to a position of the disconnection in the scanning signal line 16. That is, according to the active matrix substrate 5d, a disconnection of a scanning signal line can be corrected. Therefore, a process yield in production can be improved. In the active matrix substrate 5d, when a disconnection of a scanning signal line is corrected, no data signal line is cut. Therefore, the active matrix substrate 5d provides an advantage such that an auxiliary line is dispensable for the correction of the disconnection. Further, in comparison with configurations of FIGS. 1 and 2, the active matrix substrate 5d provides an advantage such that positions to be cut for the correction is reduced by two.

In this way, according to the active matrix substrate 5d, it is possible to supply a signal potential to each of transistors 12a and 12b that are connected to the scanning signal line 16 where a disconnection occurs and the data signal line 15 that is cut. Further, it is also possible to supply a signal potential to each of transistors 12A and 12B that are connected to the scanning signal line 16 and the data signal line 15q that is cut. This makes it possible to correct a disconnection of the scanning signal line 16 while no defective pixel is produced.

Note that, when the bypass is formed, a capacitance (Cgd) between the scanning signal line 16 and a first pixel electrode 17a that is connected to the transistors 12a and 12b becomes higher than those of other pixel electrodes. In order to solve this problem, an electrode ma for correction and a storage capacitor electrode extended section 18sa are melt-connected in a case where a sub-pixel including the first pixel electrode 17a becomes a bright dot due to an increase in the Cgd. This allows the first pixel electrode 17a to be electrically connected to a storage capacitor line 18q (and a main body of the storage capacitor line 18a). This makes it possible to turn the sub-pixel including the first pixel electrode 17a into a black dot.

Figure 10:
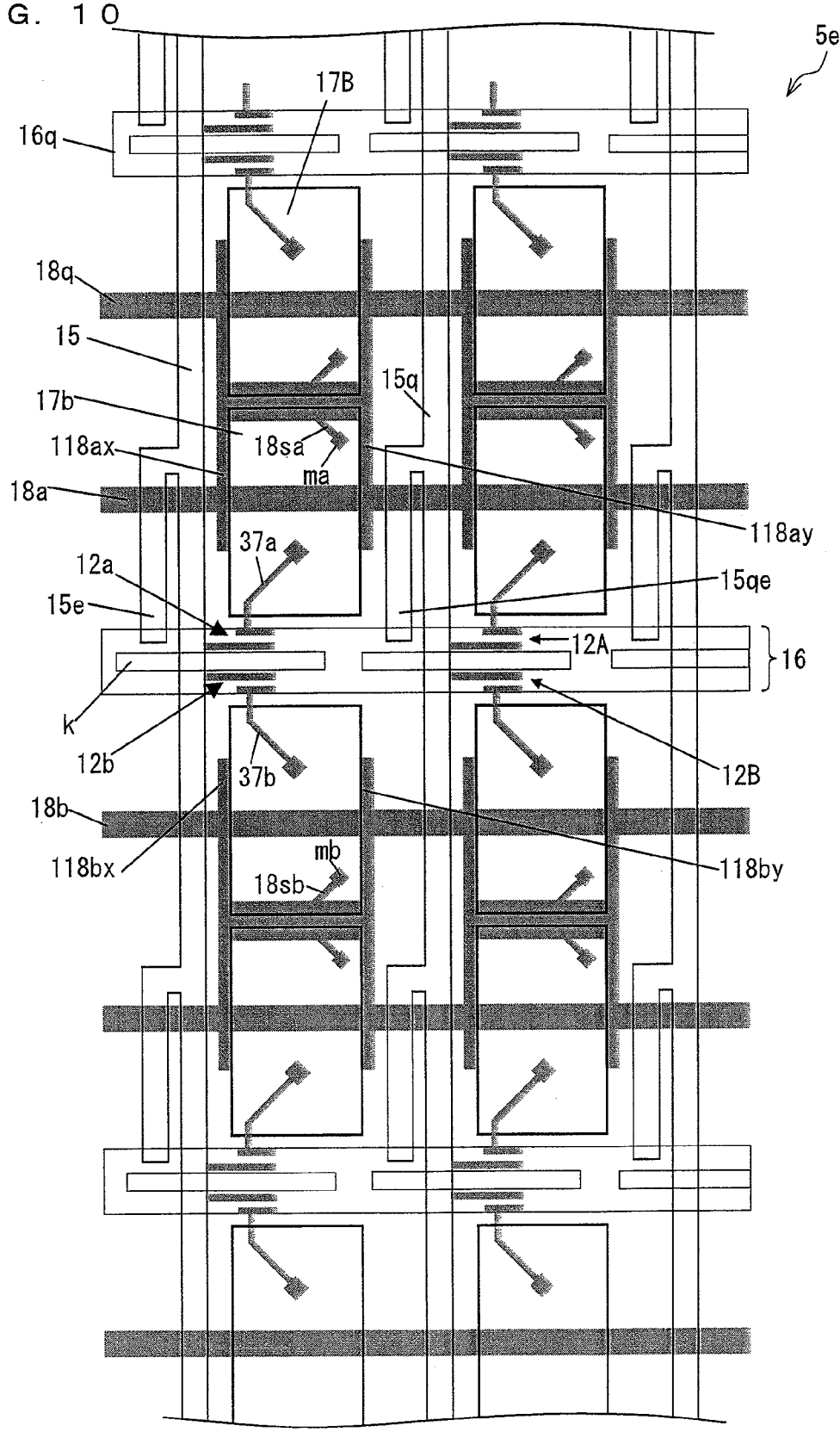
FIG. 10 is a plan view illustrating another configuration of an active matrix substrate of Embodiment 2.

The active matrix substrate of the present embodiment may be configured as shown in FIG. 10. FIG. 10 shows an active matrix substrate 5e in which an aperture section that reaches inside a pixel area from outside the pixel area is formed in each scanning signal line and in which portions of the each scanning signal line on respective sides of the aperture section function as respective gate electrodes for transistors. For example, in a scanning signal line 16, an aperture section K that reaches inside a pixel area 3 from outside the pixel area 3. The scanning signal line 16 includes, on respective sides of the aperture section K, portions that function as respective gate electrodes of the transistors 12a and 12b. Further, drain lead wires 37a and 37b each extended from a drain electrode, storage capacitor line extended sections 18sa, 18sb, and 18sq, electrodes ma, mb, and mq for correction, or the like are arranged to overlap alignment control structures, such as ribs (light-shielding protrusions provided on a color filter substrate) used in a multi-domain mode (e.g., MVA mode). Other configuration of the active matrix substrate 5e is the same as that of the active matrix substrate 5d (See FIG. 8).

According to the active matrix substrate 5e, for example, in a case where a short circuit between a gate and a source (short circuit between a data signal line and a scanning signal line, a short circuit between a scanning signal line and a source electrode of a transistor) occurs, the short circuit can be corrected by cutting a part of the scanning signal line. For example, in a case where the data signal line 15 and the scanning signal line 16 are short-circuited, a portion including a short-circuited section of the scanning signal line 16 is cut off from a main body the scanning signal line 16, and the electrode ma for correction and a storage capacitor electrode extended section 18sa are melt-connected. This can correct the short circuit between the gate and the source and turn a sub-pixel including a first pixel electrode 17a into a black dot. Further, because light-shielding members (e.g., drain lead wires, storage capacitor electrode extended lines, or electrodes for correction) are arranged to overlap light-shielding members (ribs) on the color filter substrate, a substantial pixel aperture ratio is improved.

Further, as shown in FIG. 16, a liquid crystal display device 70 of the present invention is configured to include the liquid crystal panel described above, a gate driver 71, a source driver 72 and a Cs drive circuit 73 each of which drives the liquid crystal panel, and a control device 74 that controls the gate driver 71, the source driver 72 and the Cs drive circuit 73.

Further, in a case where the liquid crystal display device is used to display an image in accordance with a television broadcast, the liquid crystal display device 70 is connected to a tuner section 75 as shown in FIG. 16. Thereby, a television receiver 80 of the present invention is configured.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

A liquid crystal panel and a liquid crystal display device of the present invention are suitably applied to, for example, a liquid crystal television.

The invention claimed is:

1. An active matrix substrate comprising:
scanning signal lines extending in a first direction;
data signal lines extending in a second direction;
storage capacitor lines extending in the first direction;
two storage capacitor lines electrically connected to each other are provided between two adjacent scanning signal lines;
a first data signal line extended section extending from one of two adjacent data signal lines; and
a second data signal line extended section extending from another one of the two adjacent data signal lines,
the first data signal line extended section and the second data signal line extended section overlapping one scanning signal line,
the two adjacent data signal lines intersecting with a storage capacitor line adjacent to the one scanning signal line.

2. The active matrix substrate as set forth in claim 1, wherein:
each of the first data signal line extended section and the second data signal line extended section intersects with the storage capacitor line adjacent to the one scanning signal line.

3. The active matrix substrate as set forth in claim 1, further comprising:
storage capacitor electrodes each electrically connected to the storage capacitor line adjacent to the one scanning signal line; and
pixel electrodes each forming, with the storage capacitor line, a capacitor,
the storage capacitor electrodes each overlapping a pixel electrode.

4. The active matrix substrate as set forth in claim 1, further comprising:
bridging sections each connecting the two storage capacitor lines, the bridging sections being provided so as to form a ladder-like shape.

5. The active matrix substrate as set forth in claim 1, wherein:
two pixel electrodes are provided in each pixel area;
one of the two pixel electrodes provided in one of two pixel areas adjacent to each other in the second direction forms a capacitor with one of the two storage capacitor lines; and
one of the two pixel electrodes provided in another one of the two pixel areas forms a capacitor with another one of the two storage capacitor lines.

6. An active matrix substrate comprising:
scanning signal lines extending in a first direction;
data signal lines extending in a second direction;
a plurality of storage capacitor lines extending in the first direction;
pixel electrodes in pixel areas each crossed by one scanning signal line, each of the pixel areas including at least one pixel electrode provided on one side of the one scanning signal line and at least one pixel electrode provided on another side of the one scanning signal line, the each pixel area being crossed by one storage capacitor line on one side of the one scanning signal line and by another storage capacitor line on another side of the scanning signal line;
storage capacitor line extended sections each extending from a position on a storage capacitor line between (i) an intersection of the storage capacitor line and one of two adjacent data signal lines and (ii) an intersection of the storage capacitor line and another one of the two adjacent data signal lines; and
data signal line extended sections each extending from a position on a data signal line between (i) an intersection of the data signal line and one of two adjacent scanning signal lines and (ii) an intersection of the data signal line and another one of the two adjacent scanning signal lines,
wherein a storage capacitor line extended section extending from one of two adjacent storage capacitor lines that sandwich no scanning signal line and being positioned in a space between the two adjacent data signal lines is connected with another storage capacitor line extended section extending from another one of the two adjacent storage capacitor lines and positioned in the space,
wherein each of the storage capacitor line extended sections includes a section that does not overlap a pixel electrode,
wherein each of the data signal line extended sections has a section overlapping a scanning signal line.

7. The active matrix substrate as set forth in claim 6, wherein:
the each data signal line extended section extends from a position on the data signal line between (i) an intersection of the data signal line and the scanning signal line overlapping the each data signal line extended section and (ii) an intersection of the data signal line and a storage capacitor line adjacent to the scanning signal line.

8. The active matrix substrate as set forth in claim 6, wherein:
on an assumption that one of two storage capacitor lines adjacent to the scanning signal line which the each data signal line extended section overlaps is an adjacent storage capacitor line and that one of two scanning signal lines adjacent to the scanning signal line which the each data signal line extended section overlaps is an adjacent scanning signal line, the one scanning signal line being positioned on a same side as the adjacent storage capacitor line, the each data signal line extended section extends from a position on the data signal line between (i) an intersection of the data signal line and the adjacent storage capacitor line and (ii) an intersection of the data signal line and the adjacent scanning signal line, the each data signal line extended section intersecting with the adjacent storage capacitor line.

9. The active matrix substrate as set forth in claim 6, further comprising:
electrodes for correction each electrically connected to a pixel electrode, the electrodes for correction each including an overlap section overlapping the storage capacitor line extended section or a conductive body electrically connected to the storage capacitor line extended section,
the storage capacitor line extended section including a section that does not overlap the pixel electrode in a route from a point of connection with the storage capacitor line to the overlap section.

10. The active matrix substrate as set forth in claim 6, further comprising:
transistors each corresponding to a pixel electrode provided in the each pixel area, the transistors each connected to the one scanning signal line.

11. The active matrix substrate as set forth in claim 6, wherein:
   each of the pixel electrodes provided in the each pixel area is connected to one data signal line via a transistor.

12. The active matrix substrate as set forth in claim 6, wherein:
   the each storage capacitor line extended section is formed along a pixel electrode.

13. The active matrix substrate as set forth in claim 8, wherein:
   the scanning signal line is provided with an aperture section reaching inside a pixel area from outside the pixel area.

14. The active matrix substrate as set forth in claim 11, wherein:
   a portion of the scanning signal line on each side of the aperture section functions as a gate electrode of the transistor.

15. A liquid crystal panel comprising the active matrix substrate as set forth in claim 1.

16. A liquid crystal display device comprising the liquid crystal panel as set forth in claim 15.

17. A television receiver comprising:
   the liquid crystal display device as set forth in claim 16; and
   a tuner section receiving a television broadcast.

18. A liquid crystal panel comprising the active matrix substrate as set forth in claim 6.

19. A liquid crystal display device comprising the liquid crystal panel as set forth in claim 18.

20. A television receiver comprising:
   the liquid crystal display device as set forth in claim 19; and
   a tuner section receiving a television broadcast.

* * * * *